United States Patent
Moslehi et al.

(10) Patent No.: US 9,583,651 B2
(45) Date of Patent: Feb. 28, 2017

(54) SYSTEMS AND METHODS FOR ENHANCED LIGHT TRAPPING IN SOLAR CELLS

(71) Applicant: SOLEXEL, INC., Milpitas, CA (US)

(72) Inventors: Mehrdad M. Moslehi, Los Altos, CA (US); Virendra V. Rana, Los Gatos, CA (US); Solene Coutant, Milpitas, CA (US); Heather Deshazer, Milpitas, CA (US); Pranav Anbalagan, San Jose, CA (US); Benjamin Rattle, Milpitas, CA (US)

(73) Assignee: Solexel, Inc., Milpitas, CA (US)

( * ) Notice: Subject to any disclaimer, the term of this patent is extended or adjusted under 35 U.S.C. 154(b) by 0 days.

(21) Appl. No.: 13/727,393

(22) Filed: Dec. 26, 2012

(65) Prior Publication Data
US 2014/0017846 A1    Jan. 16, 2014

Related U.S. Application Data

(60) Provisional application No. 61/580,290, filed on Dec. 26, 2011, provisional application No. 61/696,725, filed on Sep. 4, 2012.

(51) Int. Cl.
| | |
|---|---|
| *H01L 21/00* | (2006.01) |
| *H01L 31/02* | (2006.01) |
| *H01L 31/0236* | (2006.01) |
| *H01L 31/068* | (2012.01) |
| *H01L 31/18* | (2006.01) |

(52) U.S. Cl.
CPC ...... *H01L 31/02363* (2013.01); *H01L 31/068* (2013.01); *H01L 31/0682* (2013.01); *H01L 31/1804* (2013.01); *Y02E 10/52* (2013.01); *Y02E 10/547* (2013.01); *Y02P 70/521* (2015.11)

(58) Field of Classification Search
CPC ... H01L 31/042; H01L 31/0236; H01L 31/18; H01L 21/00
USPC ............. 438/71, 96–98, 57, 72; 257/E31.13, 257/E31.011, E31.124, E31.113; 136/252–256, 244
See application file for complete search history.

(56) References Cited

U.S. PATENT DOCUMENTS

| | | |
|---|---|---|
| 4,800,179 A | 1/1989 | Mukai |
| 5,011,565 A | 4/1991 | Dube et al. |

(Continued)

FOREIGN PATENT DOCUMENTS

| | | |
|---|---|---|
| DE | 10 2009 018112 B3 | 12/2010 |
| KR | 10-2009-0025998 | 3/2009 |

(Continued)

OTHER PUBLICATIONS

Contact Definition in Industrial Silicon Solar Cells, Dr. Luis Jaime Caballero, Publisher: In Tech, Pub date: Feb. 2010.*

(Continued)

*Primary Examiner* — Jessica Manno
*Assistant Examiner* — Sheikh Maruf
(74) *Attorney, Agent, or Firm* — John Wood

(57) ABSTRACT

Methods for improving the light trapping characteristics of crystalline silicon solar cells are provided. In one embodiment, the backside surface of a crystalline silicon solar cell substrate is textured with a pulsed laser beam. The textured backside surface of the crystalline silicon solar cell substrate is then annealed to remove damage from the laser texturization process.

13 Claims, 18 Drawing Sheets

(56) References Cited

U.S. PATENT DOCUMENTS

| | | |
|---|---|---|
| 5,348,589 A | 9/1994 | Arai et al. |
| 5,538,564 A | 7/1996 | Kaschmitter |
| 5,641,362 A | 6/1997 | Meier |
| 5,928,438 A | 7/1999 | Salami et al. |
| 5,989,977 A | 11/1999 | Wu et al. |
| 6,429,037 B1 | 8/2002 | Wenham et al. |
| 6,534,336 B1 | 3/2003 | Iwane et al. |
| 6,645,833 B2 | 11/2003 | Brendel |
| 6,982,218 B2 | 1/2006 | Preu et al. |
| 7,057,256 B2 | 6/2006 | Carey, III et al. |
| 7,517,709 B1 | 4/2009 | Borden |
| 7,857,907 B2 | 12/2010 | Cho et al. |
| 8,399,331 B2 | 3/2013 | Moslehi et al. |
| 8,409,976 B2 | 4/2013 | Hieslmair |
| 8,637,340 B2 | 1/2014 | Moslehi et al. |
| 2003/0017712 A1 | 1/2003 | Brendel |
| 2004/0042080 A1 | 3/2004 | Caudle et al. |
| 2004/0200520 A1 | 10/2004 | Mulligan et al. |
| 2004/0261834 A1 | 12/2004 | Basore et al. |
| 2005/0172996 A1* | 8/2005 | Hacke et al. ............... 136/256 |
| 2006/0009008 A1 | 1/2006 | Kaneuchi et al. |
| 2006/0060238 A1 | 3/2006 | Hacke et al. |
| 2006/0088984 A1 | 4/2006 | Li et al. |
| 2006/0130891 A1 | 6/2006 | Carlson |
| 2006/0228897 A1 | 10/2006 | Timans |
| 2007/0137692 A1* | 6/2007 | Carlson ....................... 136/252 |
| 2007/0151598 A1* | 7/2007 | De Ceuster ..... H01L 31/022433 |
| | | 136/256 |
| 2007/0157965 A1* | 7/2007 | Park ............................ 136/256 |
| 2007/0256728 A1 | 11/2007 | Cousins |
| 2007/0281172 A1* | 12/2007 | Couillard ............. H01L 21/268 |
| | | 428/446 |
| 2008/0132054 A1 | 6/2008 | Ribeyron et al. |
| 2008/0202576 A1 | 8/2008 | Hieslmair |
| 2008/0202577 A1 | 8/2008 | Hieslmair |
| 2009/0142879 A1* | 6/2009 | Isaka ................. H01L 31/03762 |
| | | 438/96 |
| 2009/0301557 A1* | 12/2009 | Agostinelli et al. .......... 136/256 |
| 2010/0051085 A1 | 3/2010 | Weidman et al. |
| 2010/0055822 A1 | 3/2010 | Weidman et al. |
| 2010/0059109 A1* | 3/2010 | Nakayashiki ... H01L 31/022425 |
| | | 136/255 |
| 2010/0108130 A1 | 5/2010 | Ravi |
| 2010/0144079 A1* | 6/2010 | Mayer .................... C25D 5/024 |
| | | 438/57 |
| 2010/0148318 A1* | 6/2010 | Wang et al. .................. 257/627 |
| 2010/0180128 A1* | 7/2010 | Borden et al. ................ 713/189 |
| 2010/0224229 A1 | 9/2010 | Pralle et al. |
| 2010/0240172 A1 | 9/2010 | Rana et al. |
| 2010/0243040 A1* | 9/2010 | Kim .................. H01L 31/02245 |
| | | 136/255 |
| 2010/0304521 A1 | 12/2010 | Seutter et al. |
| 2010/0319763 A1* | 12/2010 | Park ................ H01L 31/022425 |
| | | 136/255 |
| 2011/0005582 A1* | 1/2011 | Szlufcik ........... H01L 31/02245 |
| | | 136/252 |
| 2011/0012222 A1* | 1/2011 | Cho ..................... H01L 21/268 |
| | | 257/461 |
| 2011/0041910 A1* | 2/2011 | Shimomura .... H01L 31/022441 |
| | | 136/256 |
| 2011/0108098 A1* | 5/2011 | Kapur ............. H01L 31/022425 |
| | | 136/255 |
| 2011/0180128 A1 | 7/2011 | Hwang et al. |
| 2011/0265864 A1 | 11/2011 | Kim et al. |
| 2011/0300665 A1* | 12/2011 | Harley .............. H01L 31/02167 |
| | | 438/96 |
| 2012/0028399 A1* | 2/2012 | Moslehi .................. H01L 31/18 |
| | | 438/72 |
| 2012/0055541 A1* | 3/2012 | Granek et al. ................ 136/252 |
| 2012/0122272 A1* | 5/2012 | Rana ............... H01L 31/022441 |
| | | 438/98 |
| 2012/0178203 A1 | 7/2012 | Moslehi et al. |
| 2012/0225515 A1 | 9/2012 | Moslehi et al. |
| 2012/0227810 A1* | 9/2012 | Hieslmair ........... H01L 31/1804 |
| | | 136/261 |
| 2012/0291859 A1* | 11/2012 | Vineis ............... H01L 31/02363 |
| | | 136/255 |
| 2013/0130430 A1 | 5/2013 | Moslehi et al. |
| 2013/0164883 A1 | 6/2013 | Moslehi et al. |
| 2013/0217172 A1 | 8/2013 | Rana et al. |
| 2014/0158193 A1* | 6/2014 | Desphande et al. .......... 136/256 |

FOREIGN PATENT DOCUMENTS

| | | | |
|---|---|---|---|
| KR | 10-2010-0085736 | 7/2010 | |
| KR | 10-2010-0102255 | 9/2010 | |
| KR | 10-2010-0107258 | 10/2010 | |
| KR | 10-2010-0128132 | 12/2010 | |
| WO | WO/2010/057060 | 5/2010 | |
| WO | WO/2010/091466 | 8/2010 | |
| WO | WO/2010/135153 | 11/2010 | |
| WO | WO/2011/072153 | 6/2011 | |
| WO | WO 2011072153 A2 * | 6/2011 | ..... H01L 31/035281 |
| WO | WO/2011/150397 | 12/2011 | |
| WO | WO 2011150397 A2 * | 12/2011 | |
| WO | WO/2012/092537 | 7/2012 | |
| WO | WO/2012/162276 | 11/2012 | |

OTHER PUBLICATIONS

Direct patterned etching of silicon dioxide and silicon nitride dielectric layers by inkjet printing, Alison J. Lennon, Publisher: Australian Research Council Photovoltaics center of Excellence, Pub date: Jul. 2009.*

PCT International Search Report and Written Opinion dated Apr. 30, 2013 issued in PCT/US2012/071677.

PCT International Preliminary Report on Patentability dated Jul. 1, 2014 issued in PCT/US2012/071677.

Grohe et al. (2009) "Novel laser technologies for crystalline silicon solar cell production" Proceedings of SPIE, 7202: 72020P (1-12) DOI: 10.1117/12.810128.

Hermann et al. (Nov. 7, 2009) "Picosecond laser ablation of SiO2 layers on silicon substrates" Applied Physics A; Materials Science & Processing, 99(1): 151-158.

Mangersnes et al. (Feb. 23, 2010) "Damage free laser ablation of SiO2 for local contact opening on silicon solar cells using an a-Si:H buffer layer" Journal of Applied Physics, 107(4): 43518 (1-6).

* cited by examiner

Fig. 10 (photograph)

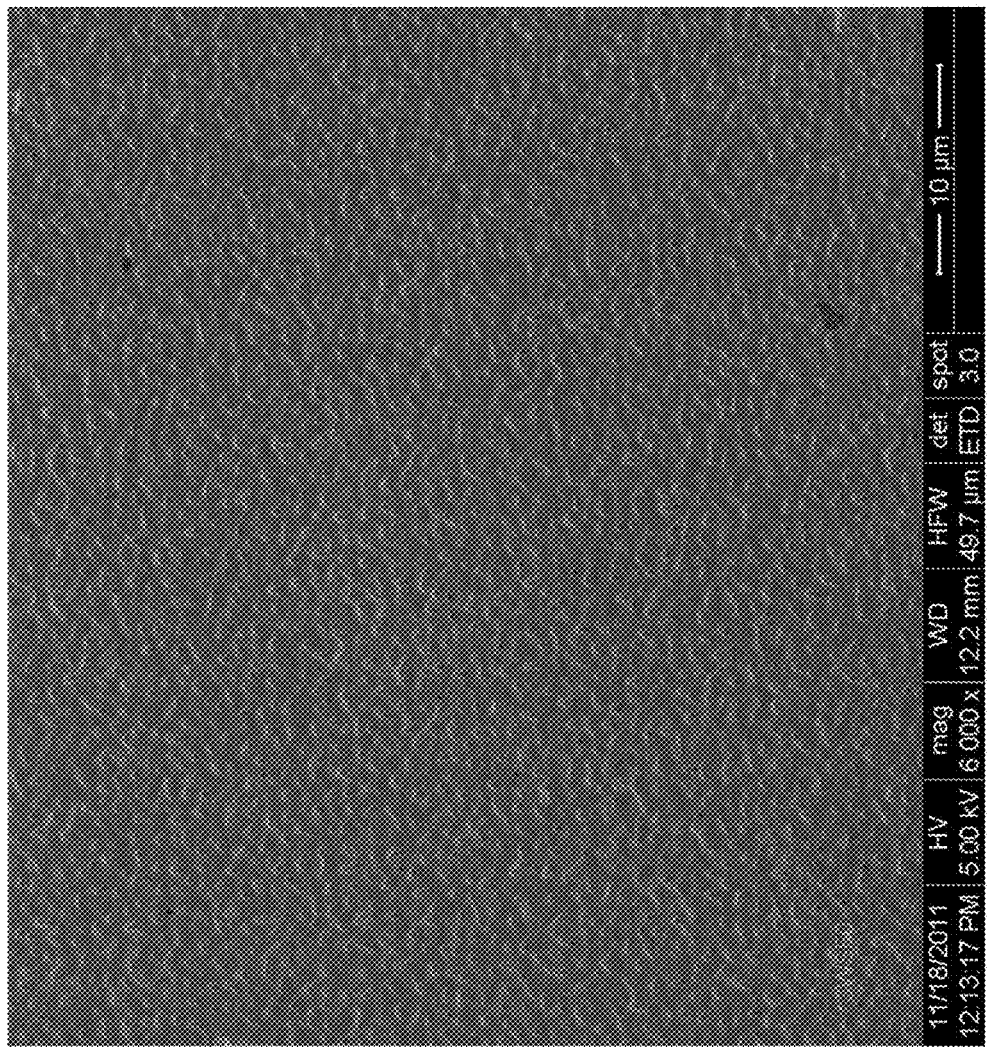
Fig. 12A (photograph)

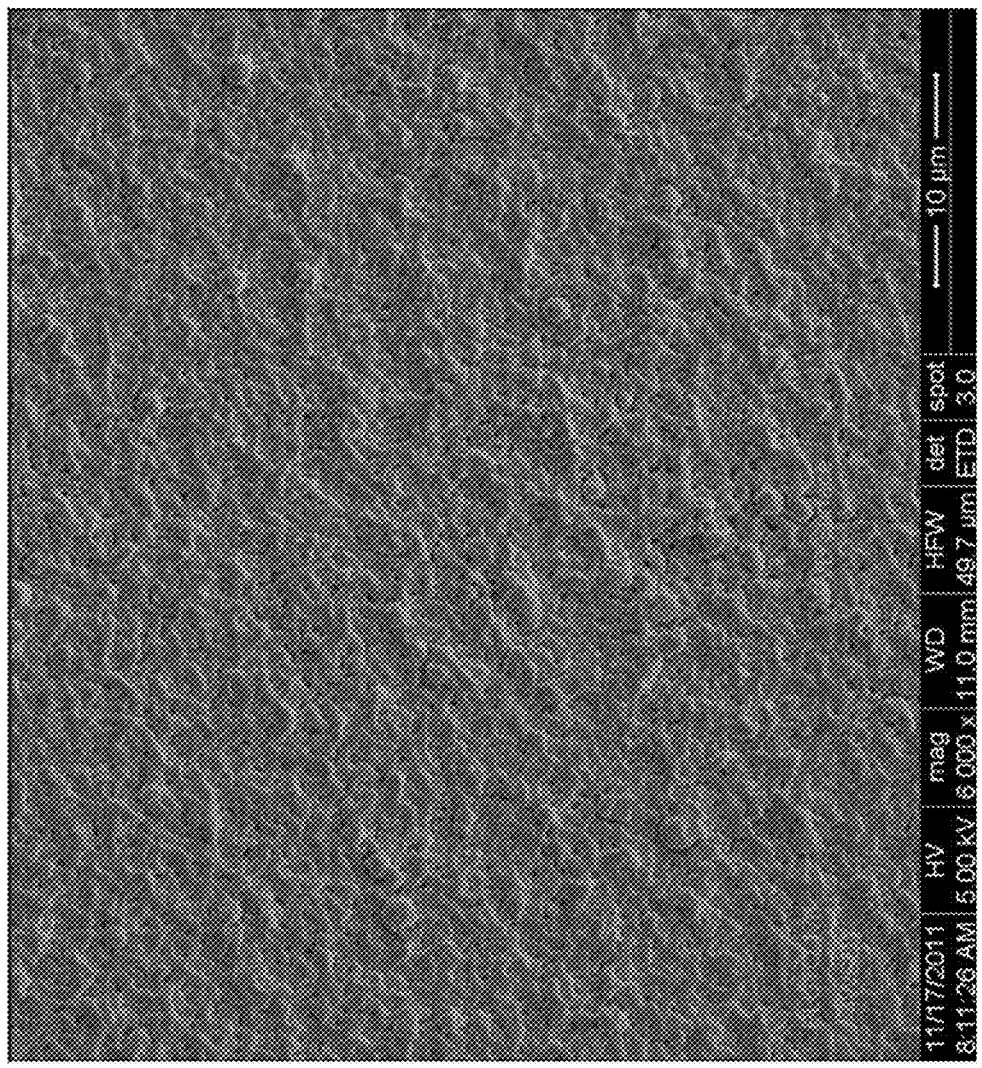
Fig. 12B (photograph)

SYSTEMS AND METHODS FOR ENHANCED LIGHT TRAPPING IN SOLAR CELLS

CROSS-REFERENCE TO RELATED APPLICATIONS

This application claims the benefit of provisional patent application 61/580,290 filed on Dec. 26, 2011, which is hereby incorporated by reference in its entirety.

This application also claims the benefit of provisional patent application 61/696,725 filed on Sep. 4, 2012, which is hereby incorporated by reference in its entirety.

FIELD OF THE INVENTION

The present disclosure relates in general to the field of photovoltaics, and more particularly to methods and structures for improving the light trapping characteristics of photovoltaic solar cells.

BACKGROUND

Often industrial solar cell, for example silicon solar cells, process flows include front surface texturization to reduce optical reflection loss in crystalline silicon solar cells. The front surface, or in other words cell surface facing solar radiation or sunnyside or frontside, is textured to reduce optical reflection losses and to increase the overall absorption of solar radiation. For example, the front surface texturization process may consist of etching the silicon surface in either an alkaline bath containing KOH or NaOH (for monocrystalline silicon cells) or in an acidic bath containing HF and HNO3 (for multi-crystalline silicon cells). The chemical etching of the silicon wafer in the alkaline bath is orientation dependent so that the slowest etching planes (111) are exposed. The etching results in the formation a randomized surface texture of square base pyramids with random micron-scale sizes and orientation that cause the reflected rays to strike the adjacent tilted random pyramid silicon surface thereby increasing light absorption. The sun rays incident on the inclined surfaces of these pyramids are reflected at an angle that increases the probability of their hitting the adjacent surface thereby increasing their absorption in the silicon bulk (and reducing the optical reflection losses of the solar cell). Combined with the use of an anti-reflection coating, such as a thin silicon nitride layer, this may be a very effective method to reduce the optical reflection losses of solar radiation in the solar cell.

However, this wet etching texturization process has a number of disadvantages. First, the amount of silicon material removed using wet alkaline chemistry texturing may be on the order of 5 to 10 microns. For thin film crystalline silicon solar cells where the starting silicon substrate thickness may be in the range of a few microns to 10's of microns, this amount of silicon loss during texturing is clearly excessive and undesirable. Additionally, while this method may be suitable in some instances for monocrystalline silicon solar cells, it has limitations when applied to multicrystalline wafers where the surface orientation of different grains is different.

Further, this type of silicon surface texturing increases surface area with numerous sharp pyramid tips, and may also increase the surface recombination velocity (i.e., the front surface recombination velocity FSRV) of minority carriers and reduce the cell open-circuit voltage. This process may not suitable for the back surface of either a front contact front junction (FCFJ) solar cell or a back contact back junction (BCBJ) solar cell. For front contact front junction solar cell (FCFJ), blanket aluminum is often deposited on the back side (usually as a screen-printed aluminum paste) and annealed or fired to form the aluminum back surface field (BSF) during which the surface texture is destroyed. High efficiency front contact front junction (FCFJ) solar cells have structures where a passivating dielectric film is first deposited on the back side and the blanket film of aluminum makes contact to silicon through contact holes made in the dielectric. Such holes may be formed using pulsed laser ablation. Alternatively, the process of forming localized contacts on the solar cell backside may be performed using a Laser-Fired Contact (LFC) process using a pulsed nanosecond laser tool. The ablation of the dielectric (or formation of LFC contacts) is severely and detrimentally impacted by the presence of the texture. For back contact, back junction (BCBJ) solar cells, the processes that are used to form the structure on the back side are unfavorably affected by the presence of texture on the silicon surface. For these reasons, back surface of high efficiency cells are typically flat (i.e., the back surface of silicon is usually not textured) and the structure consists of a passivating layer of an oxide (or nitride) on this flat surface followed by forming base openings (front contact cells) or both emitter and base openings (back contact, back junction cells) followed by the deposition of a metal film, typically aluminum, that covers the backside surface (the BSF for front contact cells or a large amount of metal surface area for BCBJ cells). Optimization of the oxide (or nitride) film thickness and the reflectivity of the metal film may yield high reflection of sun rays from the back surface. However, this reflection is mostly or completely specular and the sun rays reflected vertically back up from the flat 'mirror' have a high chance of escaping the silicon film without absorption. A specular rear mirror reflection does not maximize the mean travel path length of infrared photons, thus the—quantum efficiency for these photons is not improved significantly.

SUMMARY

Therefore, a need has arisen for improved light trapping characteristics in solar cells. In accordance with the disclosed subject matter, methods for improving the light trapping characteristics of solar cells are provided which substantially eliminate or reduce disadvantages associated with previously developed solar cell processing methods.

According to one embodiment of the disclosed subject matter, crystalline silicon solar cell processing methods for a back contact solar cell are provided. The backside surface of a back contact solar cell crystalline silicon substrate is textured with a pulsed laser beam. The textured backside surface of the back contact solar cell crystalline silicon substrate is then annealed to remove damage from the laser texturization process. Backside metallization may then be formed on backside base and emitter regions.

These and other aspects of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGUREs and detailed description. It is intended that all such additional systems, methods, features and advantages that are included within this description, be within the scope of any claims.

BRIEF DESCRIPTION OF THE DRAWINGS

For a more complete understanding of the disclosed subject matter and advantages thereof, reference is now made to the following brief descriptions set forth below when taken in conjunction with the accompanying drawings in which like reference numbers indicate like features and wherein:

FIGS. 12A and 12B are micrographs showing the difference in the surface texture of PVD metal deposited on an untextured silicon surface of a solar cell (FIG. 12A) and a textured silicon surface of a solar cell (FIG. 12B);

Figure 1:
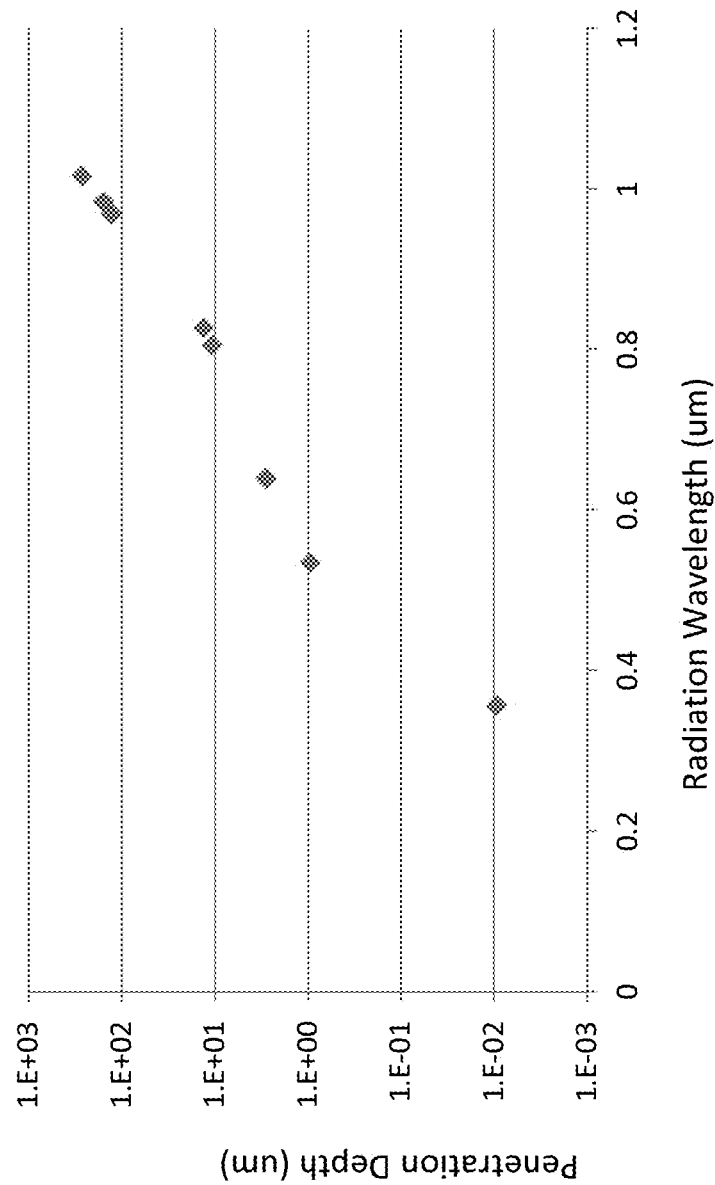
FIG. 1 is a graph showing the depths to which the radiation of various wavelengths may penetrate into crystalline silicon.

The features, natures, and advantages of the disclosed subject matter may become more apparent from the detailed description set forth below and accompanying drawings.

DETAILED DESCRIPTION

The following description is not to be taken in a limiting sense, but is made for the purpose of describing the general principles of the present disclosure. The scope of the present disclosure should be determined with reference to the claims. Exemplary embodiments of the present disclosure are illustrated in the drawings, like numbers being used to refer to like and corresponding parts of the various drawings.

Pulsed laser texturization processes that may remove ≤1 micron (or at most few microns) of surface silicon are highly suited for application to ultrathin solar cells, including multicrystalline wafers as the laser texturization is independent from the cell grain structure. However, laser irradiation of silicon may cause detrimental damage to the substrate that reduces cell efficiency. The laser annealing (or thermal furnace annealing) methods disclosed herein repairs this damage and in some cases concurrently dopes the surface of the silicon to improve the cell efficiency (for example by forming a front-surface field or FSF in a back-contact/back-junction solar cell). For a front-contact cell, the laser doping may form the emitter junction regions, and for an all back contact back junction solar cell the laser doping may form the front surface filed (FSF) to improve effective front surface passivation and reduce Front Surface Recombination Velocity (FSRV).

And while the front surface texturing described above may reduce the reflection of shorter wavelength radiation, such as UV to visible, longer solar radiation wavelengths, such as infrared radiation with photon energies closer to the silicon bandgap energy (e.g., wavelengths in the range of 900 nm to 1,150 nm), have deep penetration depths in silicon and may escape the typical silicon absorber (in the absence of an effective backside reflection). FIG. 1 is a graph showing the depths to which the radiation of various wavelengths may penetrate into crystalline silicon and indicating much less absorption for longer IR wavelengths (particularly above 800 nm). As shown in FIG. 1, wavelengths greater than 1 micron would escape a standard 150 to 180 micron thick crystalline silicon solar cell. In some advanced solar cell designs with isolated metal contacts, the oxide passivation layers along with the aluminum film are used to reflect these long wavelength radiations back into the silicon bulk. However, as the thickness of the solar cell is reduced (for instance, for thin-film monocrystalline silicon solar cells with cell absorber thickness in the range of up to—tens of microns, for example 100, most of this IR radiation, particularly if specularly reflected from the backside, may escape from the front of the solar cell surface without contributing to the overall solar cell conversion efficiency. While shorter wavelengths may be absorbed in the lower depths of silicon films, as the thickness of silicon absorber layer is reduced, radiation of ever smaller wavelengths would escape the silicon film. Thus, as the thickness of the crystalline silicon solar cell is reduced to well below 100 microns it becomes increasingly important to find ways to randomize this reflection from the back surface of the solar cell (such as by forming a diffuse rear mirror as part of the light trapping structure) so that its length of traverse in the absorber layer, as well as the internal reflection, are substantially increased—thus providing efficient trapping and absorption of long wavelength radiation.

In relation to a solar cell backside, the damage introduced by laser to the backside may be removed by thermal annealing, for example in a furnace thermal anneal (and/or oxidation) or laser annealing. As described in reference to the front surface, laser annealing may be also used to dope the silicon surface, for example to form a back surface field (BSF) for front contacted solar cells and emitter junction and base contact diffusion regions for back junction back contact solar cells.

Solar cell fabrication processes texturing either the frontside or the backside (in other words the solar cell side opposite the sunny side) using a pulsed laser beam are provided herein. In one embodiment, both the frontside and the backside of the solar cell are textured using a pulsed laser beam. The surface texture may be formed using a pulsed beam laser scanning the wafer at an appropriate pulse repetition rate (PRR) and scan speed providing the desired overlap of pulses. The average depth of the texture is controlled by controlling the pulse energy and may be in the range of approximately 0.1 micron to several microns.

A key aspect of the pulsed laser texture processing methods disclosed herein is the control and elimination of silicon damage caused by the pulsed laser beam during texturing. This damage may be strongly dependent on the pulse length and the wavelength of the laser beam used. For example, the use of continuous wave, or long pulse length lasers such as micro-seconds or nanoseconds, may provide texture on the silicon surface but also cause significant melting and formation of a defective region (the so called "heat affected zone (HAZ)"). This defective region may be removed by wet etching or repaired by high temperature, long time, thermal annealing (for example at 1000 degrees C. for a few hours) which makes the texturization process expensive. The laser damage may be significantly less when using a picoseconds or a femtoseconds pulse width lasers, in which case the damage to silicon is localized near the surface and may be repaired using a suitable thermal annealing (for example at 600 degrees C. for 30 minutes) or laser annealing step integrated into the solar cell process flow. Further, the amount of material removed is much less when using a shorter pulse length, such as a picoseconds or a femtoseconds pulse width lasers. Thus, a picoseconds or femtoseconds pulse length laser is advantageous over long pulse length laser for silicon surface texturing in some applications.

For laser annealing, the wavelength and pulse length of the laser may be optimally selected based on the silicon thickness and the process flow restrictions. For typical wafer based solar cells in the range of 130 to 180 micron thick, a continuous wave or pulsed microseconds or nanoseconds pulse length laser beam with infrared (IR) wavelength is suitable for annealing. For a back-junction/back-contact cell, for example formed from an epitaxial layer grown on a template (and released from the template using a sacrificial porous layer) where excessive heat transfer to the template is to be avoided, pulsed nanoseconds IR or green lasers are more suitable.

For laser doping applications, the depth of doping also depends on the pulse length and wavelength of the laser. As shown in FIG. 1, longer wavelengths go deeper into silicon. For the typical doping depths required for emitter, back-surface field (BSF), and front-surface field (FSF), shorter wavelengths such as green and UV may selected over red or infrared. Thus, the use of short pulse length laser (<1000 picoseconds up to femtoseconds) for texturing along with shorter pulse wavelength (<1.06 um) provides an all-dry, non-contact, silicon texturing and doping process sequence with minimal to no damage.

Figure 2:
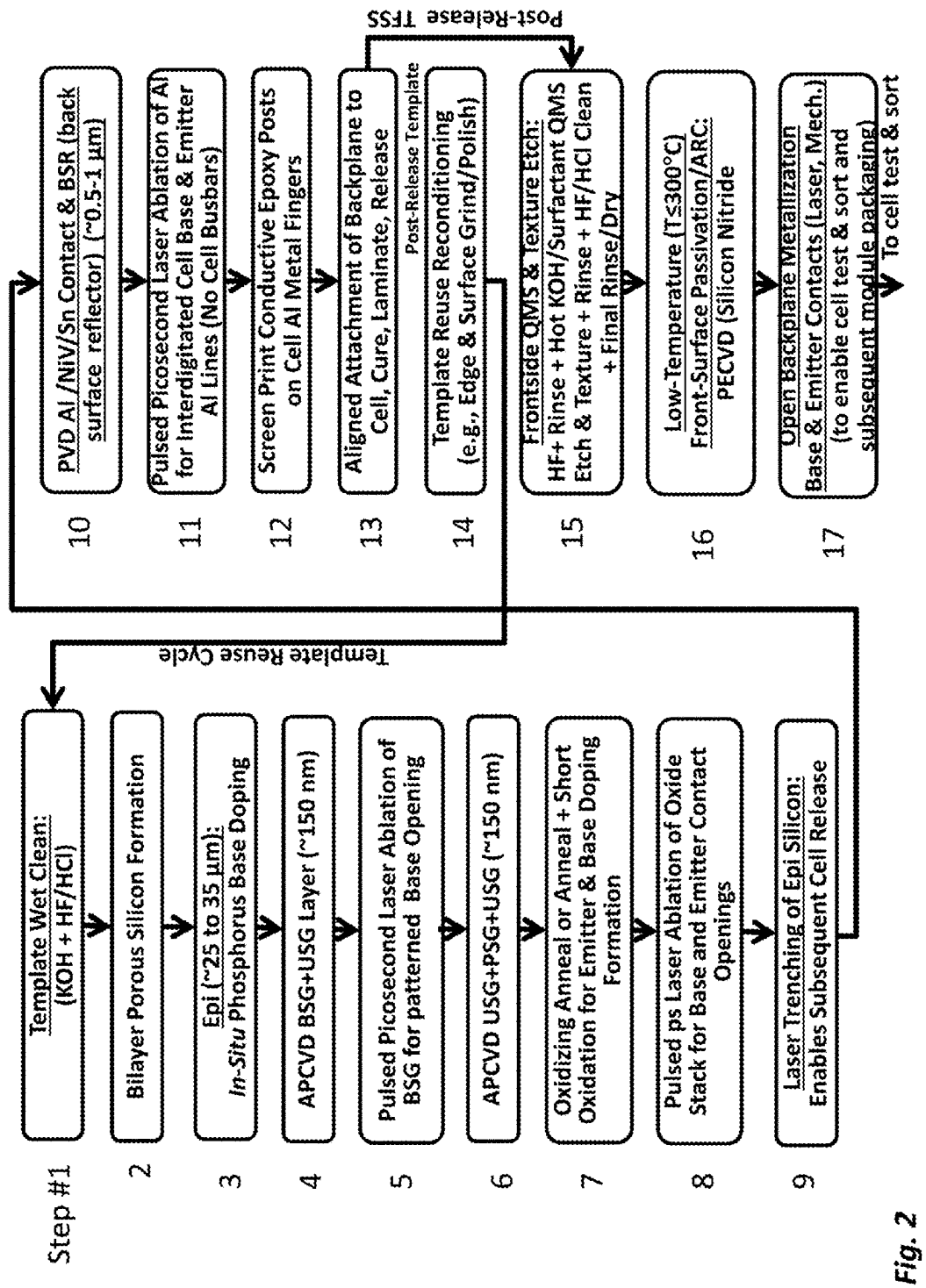
FIG. 2 is a process flow embodiment for forming a back-junction/back-contact epitaxial silicon solar cell using wet etching for front surface texturization.
Figure 3:
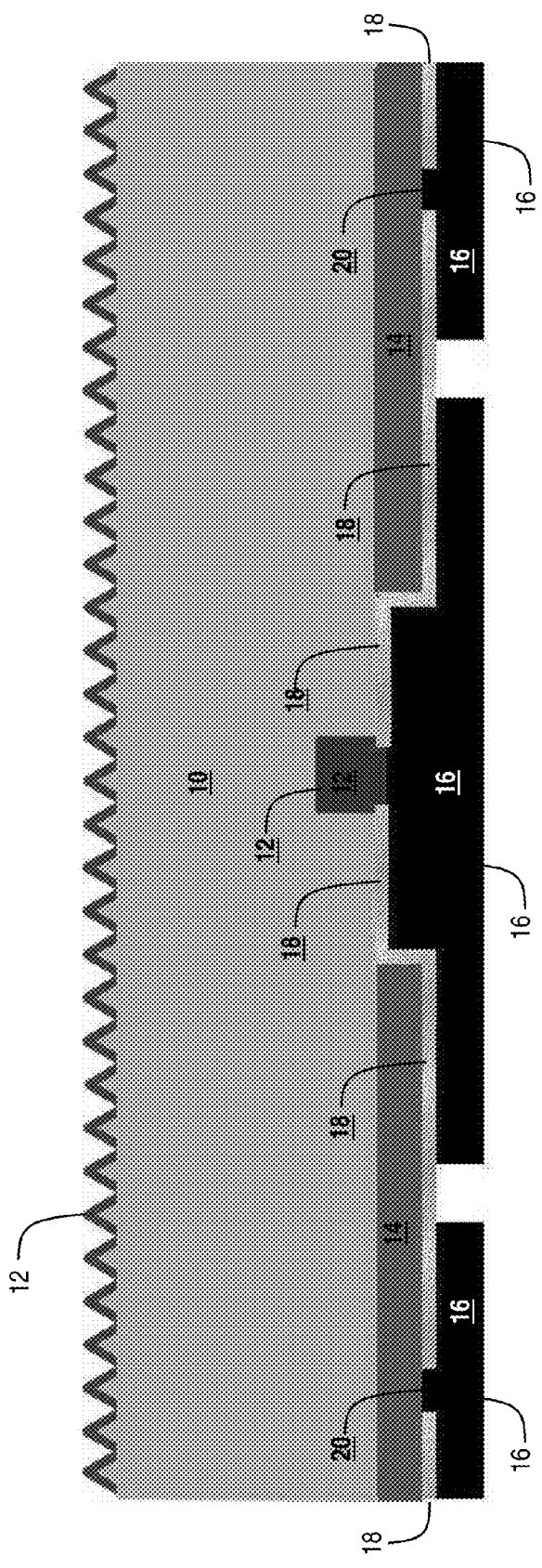
FIG. 3 is a diagram showing a cross-section of a back-junction/back-contact epitaxial silicon solar cell (backplane not shown)

The disclosed laser texturization and annealing methods may be particularly applicable for the formation of interdigitated back contact thin film crystalline silicon solar cells (IBC) with a backside interdigitated metallization pattern (herein referred to as NBLAC), such as those described in U.S. Pat. Pub. No. 2012/0028399, filed on May 27, 2011 and having a common assignee, which is hereby incorporated by reference in its entirety. FIG. 2 is a process flow embodiment for forming a back-junction/back-contact epitaxial silicon solar cell (NBLAC) using wet etching for front surface texturization (step 15). FIG. 3 is a diagram showing a cross-section of a back-junction/back-contact epitaxial silicon solar cell (backplane not shown) which may be formed according to the process flow of FIG. 2. The backside of the back-junction back-contact epitaxial silicon solar cell of FIG. 3 comprises n-type base thin epitaxial substrate 10 (for example having a thickness in the range of 30 to 50 μm), n++ base contact contacting 12 metallization layer 16 (for example an Al/NiV/Sn metal stack or Al paste) forming base metallization, p+ emitter layer 14 contacting metallization layer 16 at p+ emitter contacts 20 forming emitter metallization, and dielectric layer 18 (for example APCVD BSG/USG/PSG/USG dielectric layer). Further, base/emitter polarities may be adjusted for a p-type substrate. The frontside of thin epitaxial substrate 10 comprises textured frontside 12 which may be coated with a passivation layer such as PECVD nitride.

Figure 4:
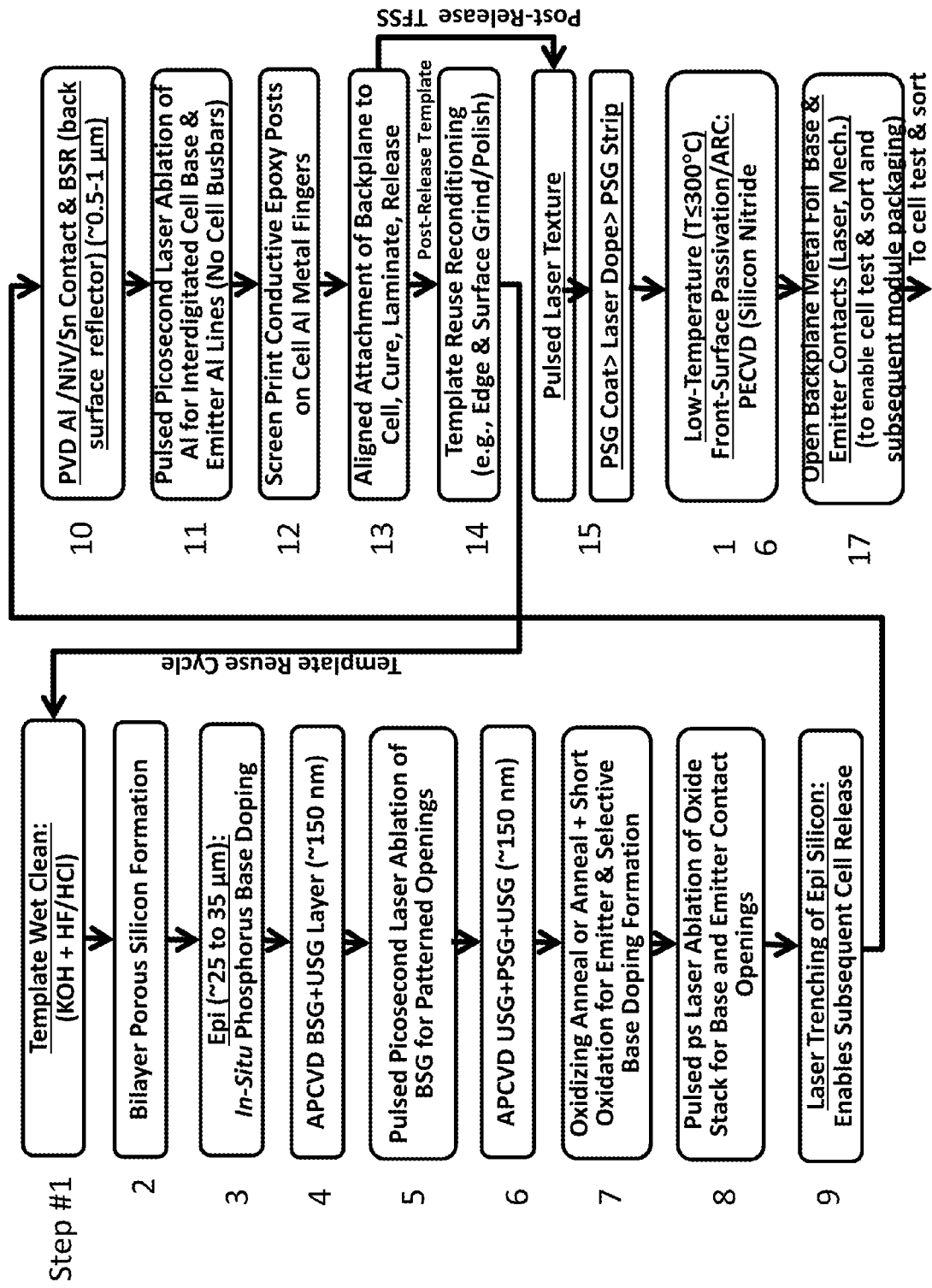
FIG. 4 is a process flow embodiment for forming a back-junction/back-contact epitaxial silicon solar cell using laser texturization for FSF formation.
Figure 5:
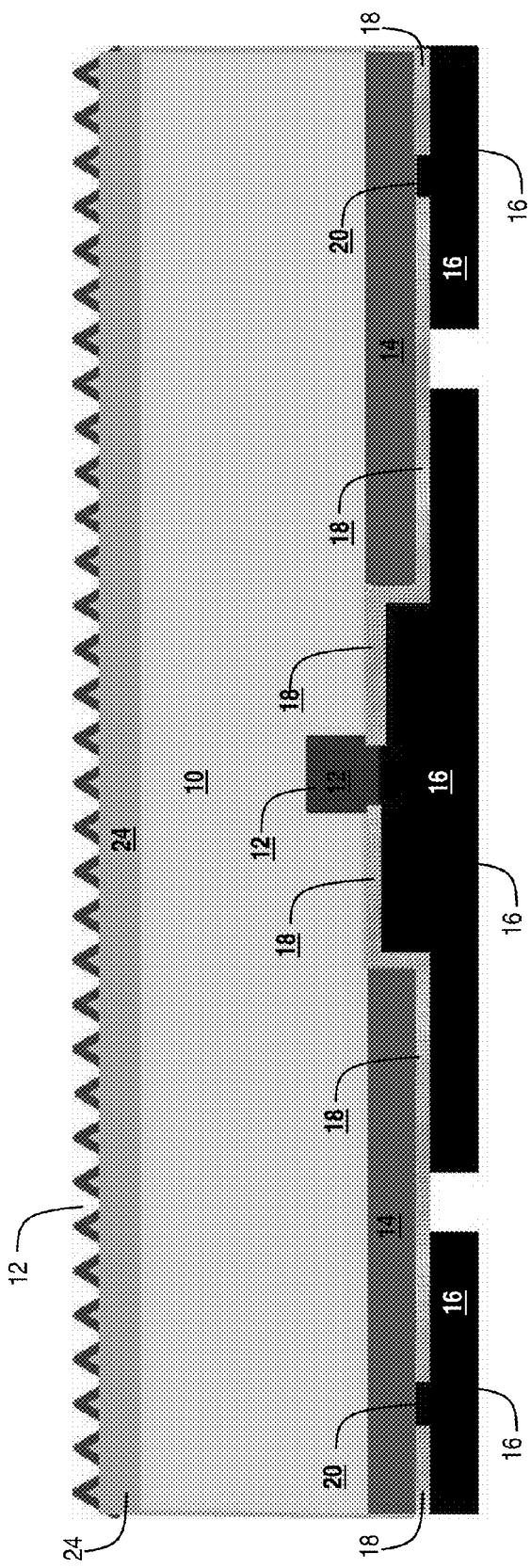
FIG. 5 is a diagram showing a cross-section of a back-junction/back-contact epitaxial silicon solar cell (backplane not shown) which may be formed according to the process flow of FIG. 4.

FIG. 4 is a process flow embodiment for forming a back-junction/back-contact epitaxial silicon solar cell (NBLAC) using laser texturization for FSF formation (steps 15). FIG. 5 is a diagram showing a cross-section of a back-junction/back-contact epitaxial silicon solar cell (backplane not shown) which may be formed according to the process flow of FIG. 4. The backside and frontside of the back-junction back-contact epitaxial silicon solar cell of FIG. 5 is similar to that shown in FIG. 3 however, the frontside of the back-junction back-contact epitaxial silicon solar cell of FIG. 5 comprises n-type front surface field 24 formed by the laser annealing processing steps shown in FIG. 4.

Figure 6:
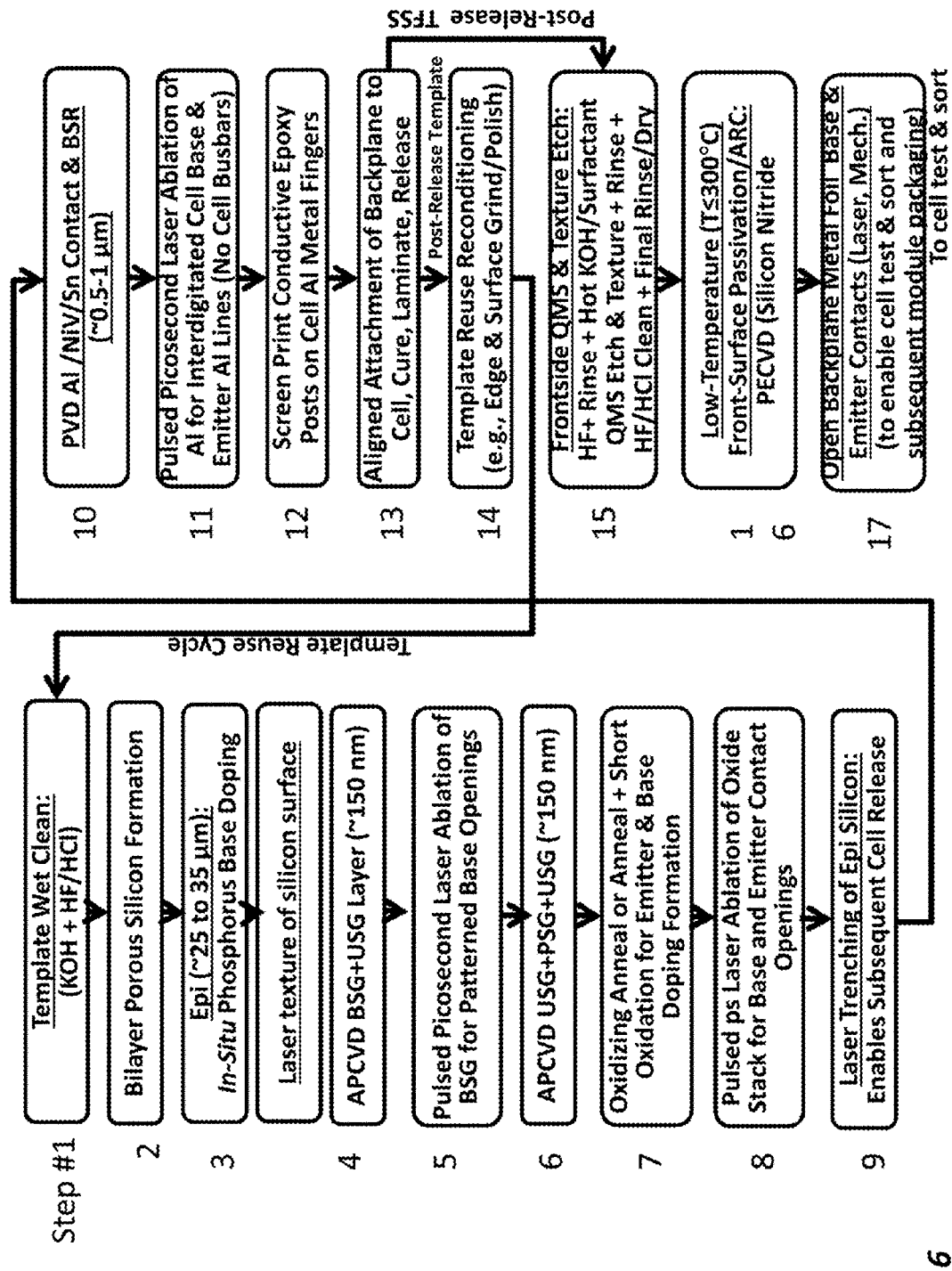
FIG. 6 is a process flow embodiment for forming a back-junction/back-contact epitaxial silicon solar cell using a laser texture to forms backside silicon substrate surface texturization.
Figure 7:
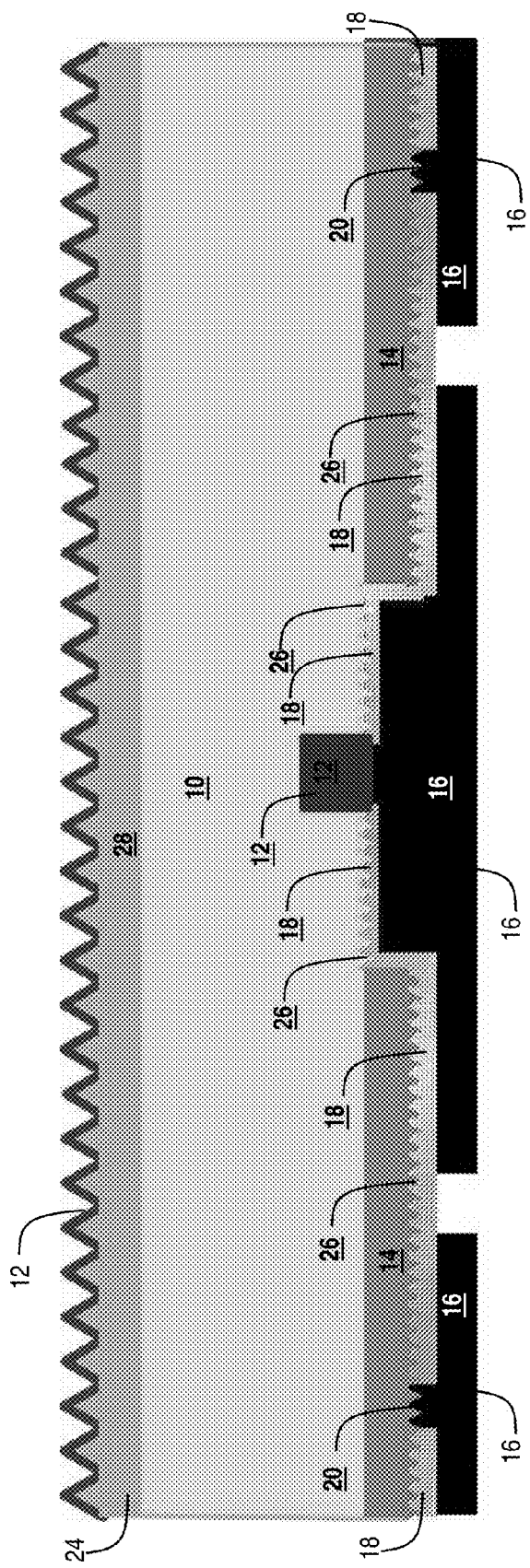
FIG. 7 is a diagram showing a cross-section of a back-junction/back-contact epitaxial silicon solar cell (backplane not shown) with backside silicon substrate surface texturization.

FIG. 6 is a process flow embodiment for forming a back-junction/back-contact epitaxial silicon solar cell using a laser texture step between step 3 and step 4 which forms backside silicon substrate surface texturization. FIG. 7 is a diagram showing a cross-section of a back-junction/back-contact epitaxial silicon solar cell (backplane not shown) formed according to the process flow of FIG. 6 highlighting backside texturization. The backside and frontside of the back-junction back-contact epitaxial silicon solar cell of FIG. 7 is similar to that shown in FIG. 5, however n-type front surface field 28 may optionally formed and the backside of the back-junction back-contact epitaxial silicon solar cell comprises laser silicon surface texturization 26.

Backside, or rear, silicon surface texture creates a randomized reflection from the back surface (more diffuse than specular) resulting in a highly reflective diffused mirror on the cell backside providing longer wavelength radiation, such as infrared radiation. A diffuse rear mirror may enhance the IR conversion efficiency of the solar cells using thin silicon layers. In the absence of a backside textured silicon surface, rear dielectric/metal reflectors may be formed with oxide layers, and metallization pattern on the backside may be relatively flat and cause strong but typically specular reflection of the long wavelength radiation, such as infrared radiation.

Figure 8:
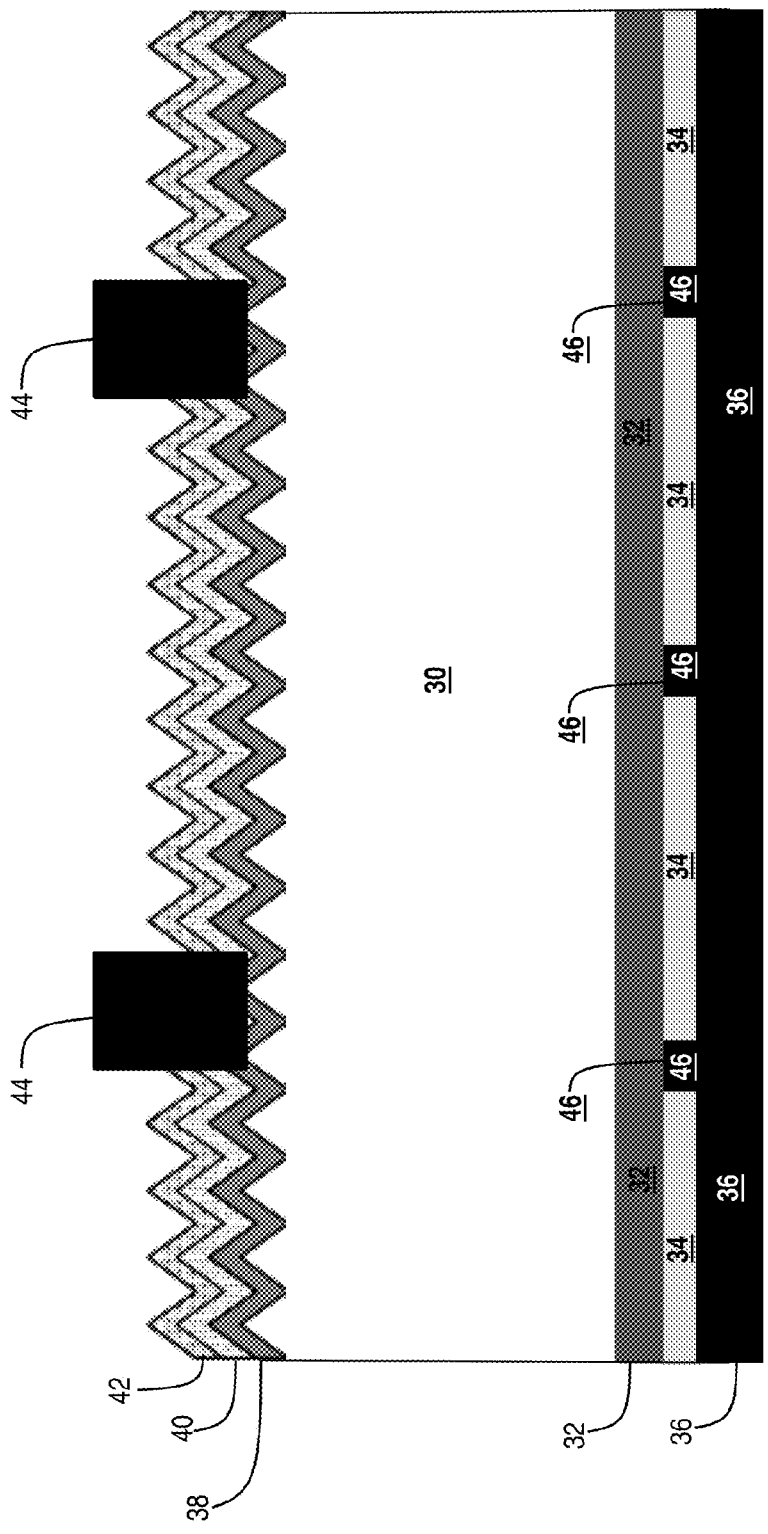
FIG. 8 is a diagram showing a cross section of a front contact cell with isolated backside metal contacts.

FIG. 8 is a diagram showing a cross section of a front contact cell with isolated backside metal contacts. Front contact cell comprises substrate 30 (for example an n-type base) having a textured frontside comprising emitter layer 38, optional oxide layer 40, and ARC layer 42 and front side emitter metallization metal grid 44. The backside of substrate 30 comprises n+ back surface field 32, passivation layer 34 (for example a silicon oxide layer), and metallization layer 36 (for example aluminum) contacting n+back surface field 32 at isolated base metallization contacts 46.

Figure 9:
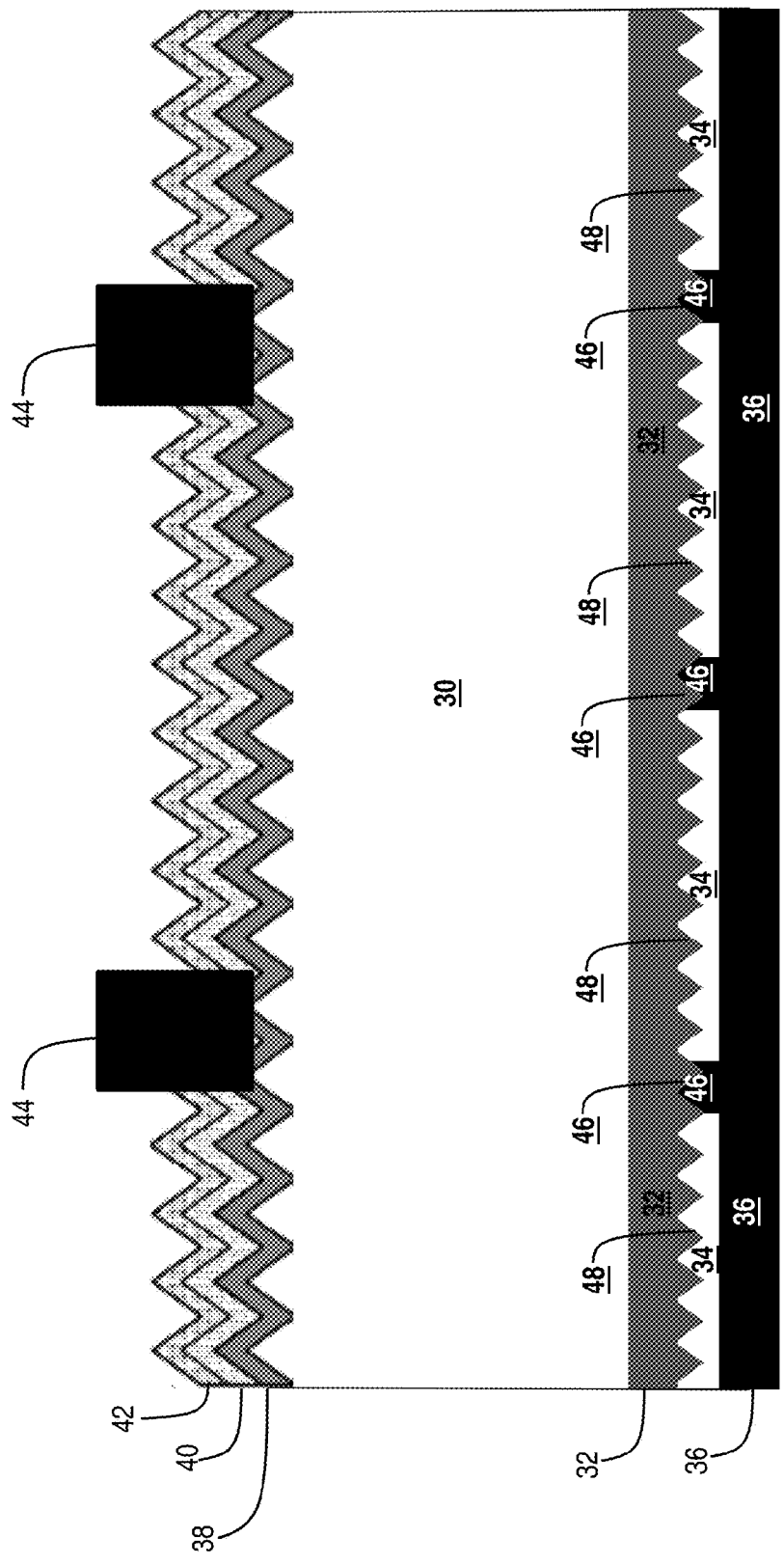
FIG. 9 is a diagram showing a cross section of a front contact cell with isolated backside metal contacts and backside texturization.

FIG. 9 is a diagram showing a cross section of a front contact cell with isolated backside metal contacts similar to FIG. 8 with backside laser textured cell surface 48 (shown as textured n+back surface field 32 of substrate 30). As described above and due to the textured backside surface, radiation from the backside of the cell will be randomized thus forming a diffuse rear mirror and resulting in improved trapping of the long wavelength radiation photons.

Figure 10:
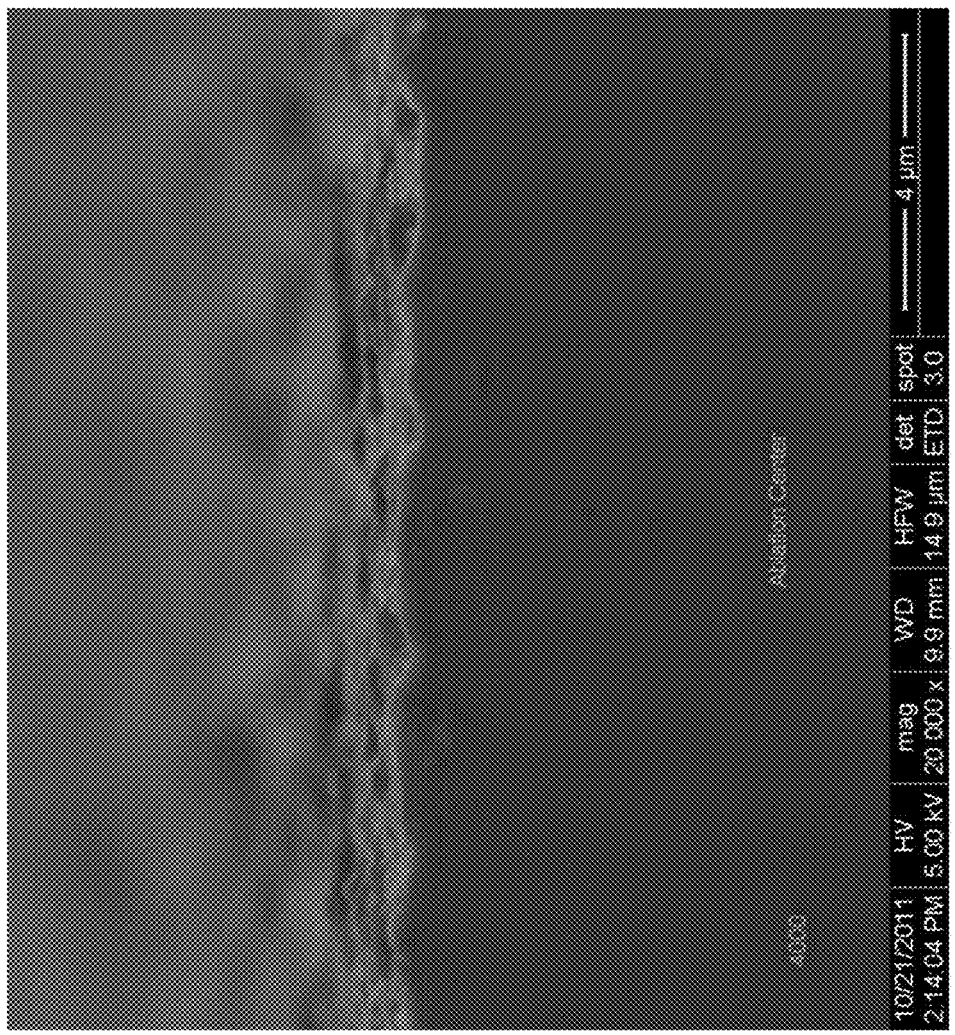
FIG. 10 is a micrograph of a silicon surface.
Figure 11:
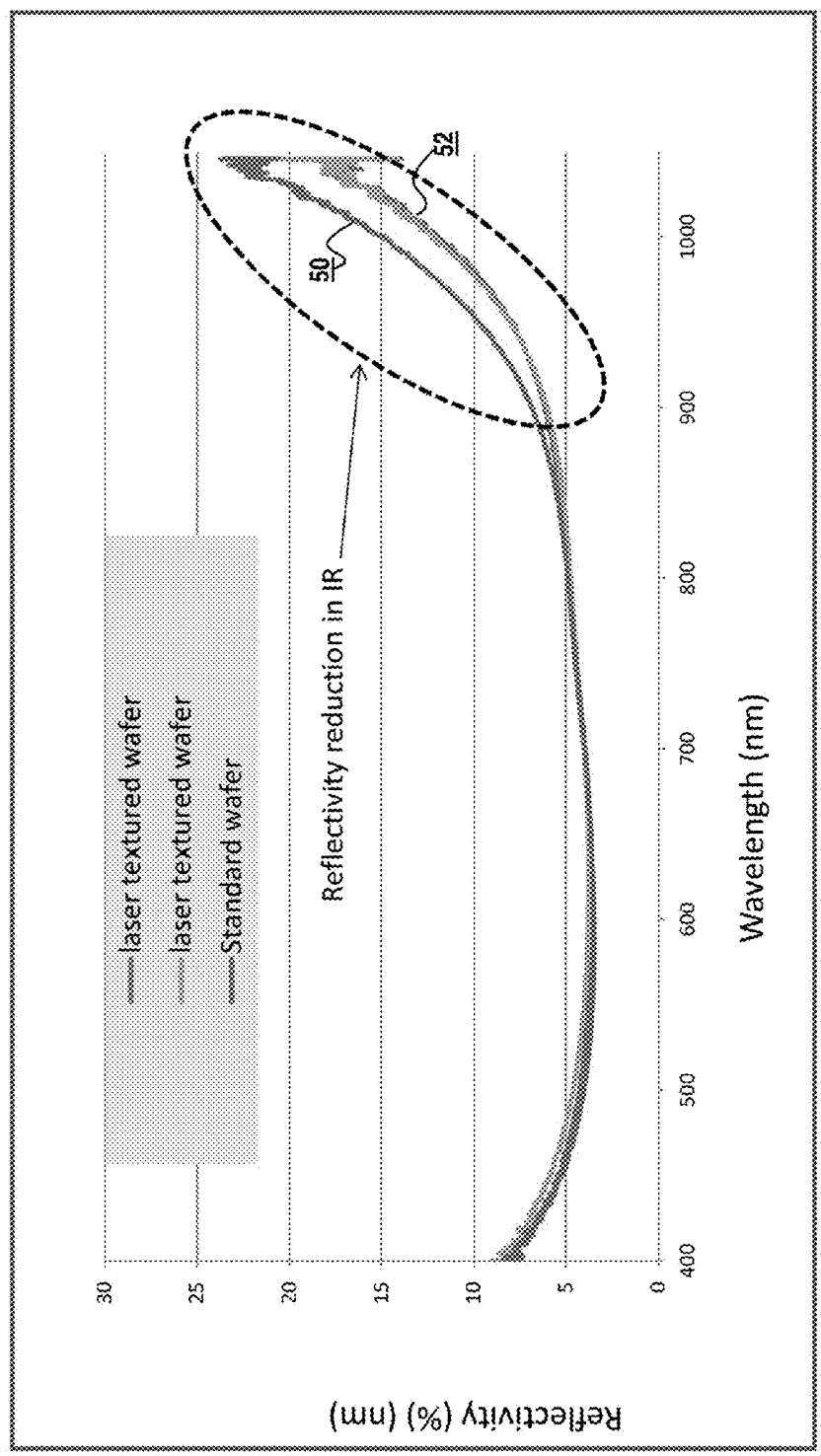
FIG. 11 is a graph of wavelength vs. reflectivity for textured and non-textured solar cells.

FIG. 10 is a micrograph showing the surface roughness obtained on a 725 micron thick mono-crystalline silicon surface textured using a 10 picoseconds, IR laser beam with a pulse energy of 156 micro-joules, with the spot pitch being 40 microns. FIG. 11 is a graph showing the decrease in reflectivity measured after the same laser parameters used in the micrograph of FIG. 10 were used to texture the silicon backside of an NBLAC (back-junction/back-contact) solar cell (shown as laser textured wafer 52) as compared to a standard untextured back contact/back junction solar cell wafer (shown as standard wafer 50).

FIGS. 12A and 12B are micrographs showing the difference in the surface texture of PVD metal deposited on APCVD oxides on an untextured silicon surface of an NBLAC solar cell (FIG. 12A) and a textured silicon surface of an NBLAC solar cell (FIG. 12B). FIG. 12A shows a 1200A A1/200A Ni-V/2250A Sn on oxide untextured backside silicon surface of an NBLAC cell. FIG. 12B shows the same silicon surface of FIG. 12A textured using a picoseconds laser with infrared wavelength.

For example, pulsed laser doping of a laser textured-surface may be performed by the following two methods:
Apply a liquid dopant source (for example phosphorous containing glass, PSG, for n-type doping, and boron containing glass, BSG, for p-type doping) on the textured surface (for example by spin coating, spray coating, etc.) followed by pulsed laser irradiation to introduce the dopant from the dopant source into a thin melt on the surface of the textured substrate. Then selectively remove the dopant source using a selective wet etch process.
Alternatively, utilize a process such as Gas-Immersion Laser Doping (GILD) where the surface of the laser-textured substrate may be directly doped by pulsed laser exposure in an ambient comprising a suitable gas-phase dopant source (such as PH3 or AsH3 for n-type doping or B2H6 for p-type doping).

Specific embodiments and aspects disclosed and/or contemplated herein relating to laser texturing (and which may be combined in various ways), include but are not limited to:
A process using a pulsed laser beam scan to texture the front side and/or the backside of a crystalline semiconductor solar cell, including crystalline silicon solar cell (including thin epitaxial silicon solar cells), followed by a subsequent pulsed laser or thermal annealing operation also used to dope the surface of silicon. This subsequent annealing and doping operation also removes the damage introduced to the silicon substrate surface during laser texture.

A process wherein the front surface of a front contacted crystalline semiconductor solar cell is laser textured followed by laser induced doping of the surface to form the emitter and to eliminate the laser induced damage.

A process wherein the front surface of silicon of a back-junction, back contact crystalline semiconductor solar cell is textured using pulsed laser beam followed by pulsed laser induced doping of the surface to form a front surface field (FSF) and to eliminate the laser-texture-induced damage.

A process wherein the back surface of silicon of a front contacted crystalline semiconductor solar cell is laser textured followed by laser induced doping of the surface to form the back surface field (BSF) and eliminate the laser induced damage.

A pulsed laser beam scan process to texture the backside of the silicon substrate of an all-back contact, back junction solar cells to improve the trapping of long wavelength radiation.

A pulsed laser beam scan process to texture the backside of the silicon substrate of an all-back contact, back junction solar cell to improve the trapping of long wavelength radiation, and the silicon damage introduced during laser texturization is subsequently removed by either laser annealing or furnace thermal anneal (or oxidation).

A pulsed laser beam scan process to texture the backside of the silicon substrate of an all-back contact, back junction solar cells to improve the trapping of long wavelength radiation followed by a laser or thermal annealing (or thermal anneal/oxidation) step to form the emitter and base regions such that the silicon damage introduced during laser texture is removed during this thermal annealing.

A pulsed laser beam scan process to texture the front and/or back surface of mono-crystalline films (for example having a thickness in the range of a few microns to 100's of microns, such as 10 to 100 microns and as low as one micron) to cause enhanced trapping of solar radiation in silicon and improve the overall solar cell efficiency.

Processing for all back contact, back-junction, interdigitated metallization solar cells formed using thin monocrystalline semiconductor films obtained using deposition techniques such as epitaxy or kerfless bulk wafer slicing techniques such as proton implant (or stress induced spalling) to improve the trapping of solar radiation and the overall solar cell conversion efficiency.

Texturization of the back silicon surface of a front contact solar cell having isolated metal contacts on the back surface to improve long wavelength radiation trapping.

Laser texturization using pulsed short pulse length (<1000 picoseconds, and up to 100 femtoseconds in some instances) laser.

Reducing/removing damage caused by laser beam texturing by subsequent laser annealing, for example using a continuous wave or microseconds laser, or a nanoseconds pulsed laser. In an NBLAC cell where a very thin (>10 microns) epitaxial silicon substrate is supported on a template, a pulsed nanoseconds IR or green wavelength laser beam may be used.

Pulsed laser doping processing for forming a front-surface field on a laser-textured surface, for example by spin coating or spray coating a dopant source on a semiconductor surface followed by pulsed laser irradiation of the semiconductor surface to cause controlled melt formation and controlled depth doping of the surface.

Pulsed laser doping processing for formation of a front-surface field on a laser-textured surface by direct Gas-Immesion Laser Doping (GILD) in a an ambient comprising a dopant source such as PH3, AsH3, or B2H6.

Manufacturing techniques for forming a diffuse or lambertian surface on the back side of the solar cells include but are not limited to:

Pulsed laser texturing of passivating dielectric films.

Additive formation of patterned texture by the deposition of dielectric islands (for example by the screen printing of discrete and/or interconnected dielectric bumps). Such patterned additive layer may be applied after contact opening and immediately before the on-cell metallization process and does not cover the contact regions.

Additive formation of a light scattering layer comprising submicron size and/or micron to microns size dielectric particles in a screen printable paste or inkjet printable ink. Such patterned additive layer may be applied after contact opening and immediately before the on-cell metallization process and does not cover the contact regions.

Laser texturing of passivation layer. Laser texturing of back surface of silicon using a picoseconds or a femtoseconds pulse length laser are described above. Crystalline silicon with a band gap of 1.1 eV absorbs radiation from DUV to IR range (with photon energy up to the bandgap energy of 1.1 eV)—these wavelengths may be used to texture a silicon surface. The use of ultra fast lasers with pulse length <1000 picoseconds, for example in the low picoseconds (<4 picoseconds) or femtoseconds range, may ablate silicon with minimal heat affected zone (HAZ) and may be used to form surface texture with highly reduced effect on the surface quality of silicon. However, the effect of laser ablation on the surface of silicon and the increase of the recombination velocity of the minority carriers on the back surface (back surface recombination velocity—BSRV) may be minimized or completely eliminated if a dielectric passivation layer positioned on the silicon surface is textured instead of the silicon surface itself.

A silicon oxide layer may be used for passivation of the backside of a back contact silicon solar cell. With a band gap of about 9 eV, silicon oxide is transparent to some commonly available laser wavelengths, down to 193 nm pulses with pulse width in the range of nanoseconds. However, nanoseconds pulses of wavelength 157 nm of sufficiently high fluence are absorbed in silicon oxide, and thus may also be used to texture the oxide surface (without its full ablation). For example, such pulses may be obtained using an Excimer laser, and an F2 laser is a known source of the 157 nm radiation.

Further, it may be useful to minimize penetration of laser beam in the oxide film for effective texturization. For example, the absorption is dramatically increased and thus the depth of penetration in oxide dramatically reduced if ultra short pulses in the femtoseconds range are used. The use of femtoseconds pulses makes it possible to use higher wavelengths so that a specialty laser may not be required. Silicon oxide films may be ablated with <500 femtoseconds pulses with wavelength in the UV to IR range, for example 1064 nm. However, green wavelength, 532 nm, or UV wavelength 355 nm, may be used because of its reduced penetration (for example in combination with a nanoseconds pulse). Femtoseconds green or UV pulses may form ripples and textures on the oxide surface that produce an excellent diffused mirror when covered with a reflective metal film, such as an aluminum film, to form a combined low-loss, high-reflectance diffuse metal-dielectric reflector.

The ripples formed by overlapping femtoseconds pulses on the oxide surface may be periodic structures with a period either smaller or larger than the wavelengths of sun rays penetrating to the back side of the solar cell—thus sun rays that make it the back of cell undergo very effective diffuse reflection from the back surface. Alternatively, the ripples formed by overlapping femtoseconds pulses on the oxide surface may be periodic structures with locally varying periods covering a range of values, for example as low as submicron periods up to 10's of microns. And in yet another embodiment, the dielectric surface may be randomly textured. Importantly, in the disclosed dielectric surface texturing methods the texturing process only textures the dielectric layer and does not punch/push through the dielectric thickness to expose the underlying silicon. In yet another alternative embodiment, non-overlapping pulsed laser ablation, for example using femtoseconds pulses, may be used to create an array of equal size craters or arrays of variably sized craters (different crater diameters) on the oxide surface. The crater diameters may cover a range of values, for example as low as submicron diameters up to 10's of microns in diameter. Further, the crater diameter may be adjusted and varied by the beam diameter and/or energy fluence of the pulsed femtosecond laser beam.

And although stoichiometric silicon oxide films are highly transparent in the UV/Visible/IR range, the absorption may be increased for non-stoichiometric silicon rich oxides of silicon. Silicon monoxide (SiO) absorbs radiation of 248 nm and below, thus the addition of this film on top of stoichiometric SiO2 may permit higher wavelengths, in particular in conjunction with the use of femtoseconds laser. Further, the use of this silicon monoxide layer may make it possible to create quality texturing using a pulse length in the low picoseconds range (for example <10 picoseconds). The silicon monoxide layer may be formed, for example, by sputter deposition of silica.

Silicon oxide used in solar cell applications is often deposited using PECVD or APCVD techniques. Such oxides are non-stoichiometric and thus more absorbent as compared to dense silicon oxide. This reduces the penetration of the femtoseconds or the short wavelength deep UV laser beam so that thin layer of deposited oxide films may be effectively textured using pulsed laser processing without complete ablation of the layer.

For p-type surfaces, aluminum oxide with negative surface charge may provide excellent surface protection. An aluminum oxide layer may be deposited by a suitable deposition technique such as Atomic Layer Deposition (ALD) or an Atmospheric-Pressure Chemical-Vapor Deposition (APCVD) process. Similar to silicon oxide, aluminum oxide may also be textured with a nanoseconds pulse of 157 nm wavelength or femtoseconds pulses of UV wavelength (the femtoseconds pulses may have an additional advantage of producing ripples on the surface). Aluminum oxide deposition using Atomic Layer Deposition (ALD) technique may be particularly suited for passivation of p-type surfaces because of the excess negative charge present in these films. Such non-stoichiometry may also increase the absorbency of these films so that picoseconds UV pulses may provide a ripple structure on the surface, which, after the deposition of a reflective aluminum film on top of the film, may provide superior diffuse reflection.

Texture using deposition of oxide (or nitride, or oxynitride) islands: Since crystalline silicon film is relatively transparent and less absorptive to sun rays in the infrared (IR) wavelength range (particularly at wavelength approximately at or above 900 nm and particularly for thinner silicon absorbers), a relatively diffuse or lambertian reflection to these wavelengths on the backside surface of the cell may improve the IR absorption and quantum efficiency by effective trapping of the IR photons. Thus, a layer with reflective elements of size and dispersion close to and/or smaller than this size and/or multiples of this size, for example 1 um, may provide effective diffuse reflection for improved light trapping and enhanced IR photon absorption.

These reflective elements or particles may be spherical or randomly geometrically shaped dielectric particles (for example made of silica, titanium oxide, aluminum oxide, and/or other non-absorbing dielectric materials) of various particle sizes (for example submicron sized particles or a mixture of submicron size particles with larger particles up to several microns) applied relatively uniformly (for example by screen printing, inkjet printing, etc.) on the surface of the passivating dielectric (for example aluminum oxide) on the backside of the solar cell. Some dielectric particles may be commonly available as fused silica particles produced by pyrolysis of silicon compounds, such as silicon tetrachloride, or by vaporizing silica sand in an electric arc. Dielectric particles may also be particles precipitated from silicate solutions or from sol gels. And as discussed, other suitable dielectric material particles, such as those made of aluminum oxide or titanium oxide, may also be utilized.

For uniform dispersion on the back surface of the solar cells, these particles can be sprayed using a volatile liquid such high molecular weight alcohols, or atomization of silica suspension in water, or they may be applied using screen printing of a paste or inkjet printing of an ink comprising such light-scattering dielectric particles. The combination of the rear side passivation layer (e.g., aluminum oxide with rear side p+ emitter) with these dielectric particles and the on-cell metallization (preferably aluminum metallization using screen printed Al paste or inkject printed Al ink) will produce a highly reflective diffuse (or near Lambertian) rear mirror to enhance the IR quantum efficiency of the solar cell.

Figure 13:
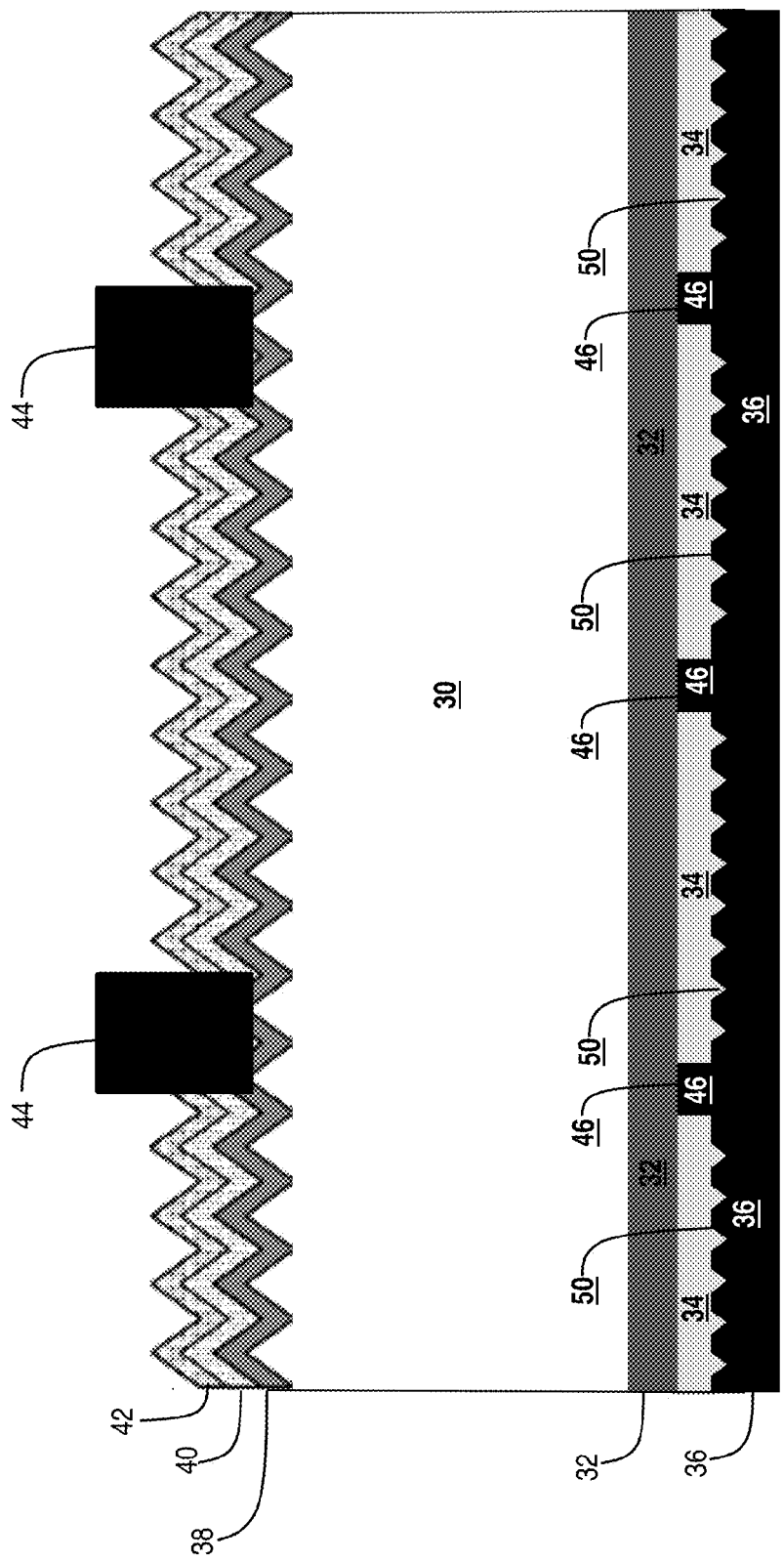
FIG. 13 is a diagram showing a cross section of a front contact cell with isolated backside metal contacts and a textured passivation layer.

FIG. 13 is a diagram showing a cross section of a front contact cell with isolated backside metal contacts similar to FIG. 8 with textured passivation surface 50 (shown as textured passivation layer 34, for example using silicon oxide as the passivation layer). Textured passivation surface 50 may be formed by laser texture by the additive methods for texturization described above. In one embodiment, silicon oxide on the back side of the front contact solar cell may be textured using a femtoseconds laser beam or DUV laser beam. Alternatively, backside IR photon scattering reflection may be achieved using an additive methods to apply the dielectric particle containing paste, or ink, onto the cell backside for enhanced IR quantum efficiency. Similar to FIG. 8, the solar cell of FIG. 13 comprises n-type base substrate 30, alternatively for a p-type base substrate 30 the back surface field will be highly p-doped (i.e., p+ back surface field 32). For a p+ back surface field, surface aluminum oxide may provide effective passivation and may be textured using a femtoseconds or a DUV laser beam. Alternatively, a diffused lambertian reflection may be obtained by the deposition of silica spheres (or other pastes or inks containing regular or random shaped/sized particles of a suitable dielectric material such as silicon oxide, aluminum oxide, silicon nitride, titanium oxide, etc.) as described above.

Again, the disclosed laser texturization methods may be particularly applicable for the formation of interdigitated back contact thin film crystalline silicon solar cells (IBC) with a backside interdigitated metallization pattern (herein referred to as NBLAC), such as those described in U.S. Pat. Pub. No. 2012/0028399, filed on May 27, 2011 and having a common assignee, which is hereby incorporated by reference in its entirety. These solar cells may be formed by the epitaxial deposition of a silicon substrate and subsequent exfoliation or porous silicon lift-off from the surface of a reusable crystalline silicon template. Thin-film crystalline solar cells, for example monocrystalline silicon solar cells, may have a thickness in the range of 10 to 100 microns thick and as low as one micron thick.

From the graph of FIG. 1, showing penetration depths of the various wavelengths into silicon, it may be clear that for thin-film silicon cells radiation in the wavelength range of 800 to 1200 nm (and particularly longer IR wavelengths) may escape through the film unless the radiation is sufficiently trapped, for example by back surface reflection. And as explained earlier, IR light trapping may be more effective if the back surface has a diffuse reflector to scatter the reflected rays (for example formed by the methods described above).

Figure 14:
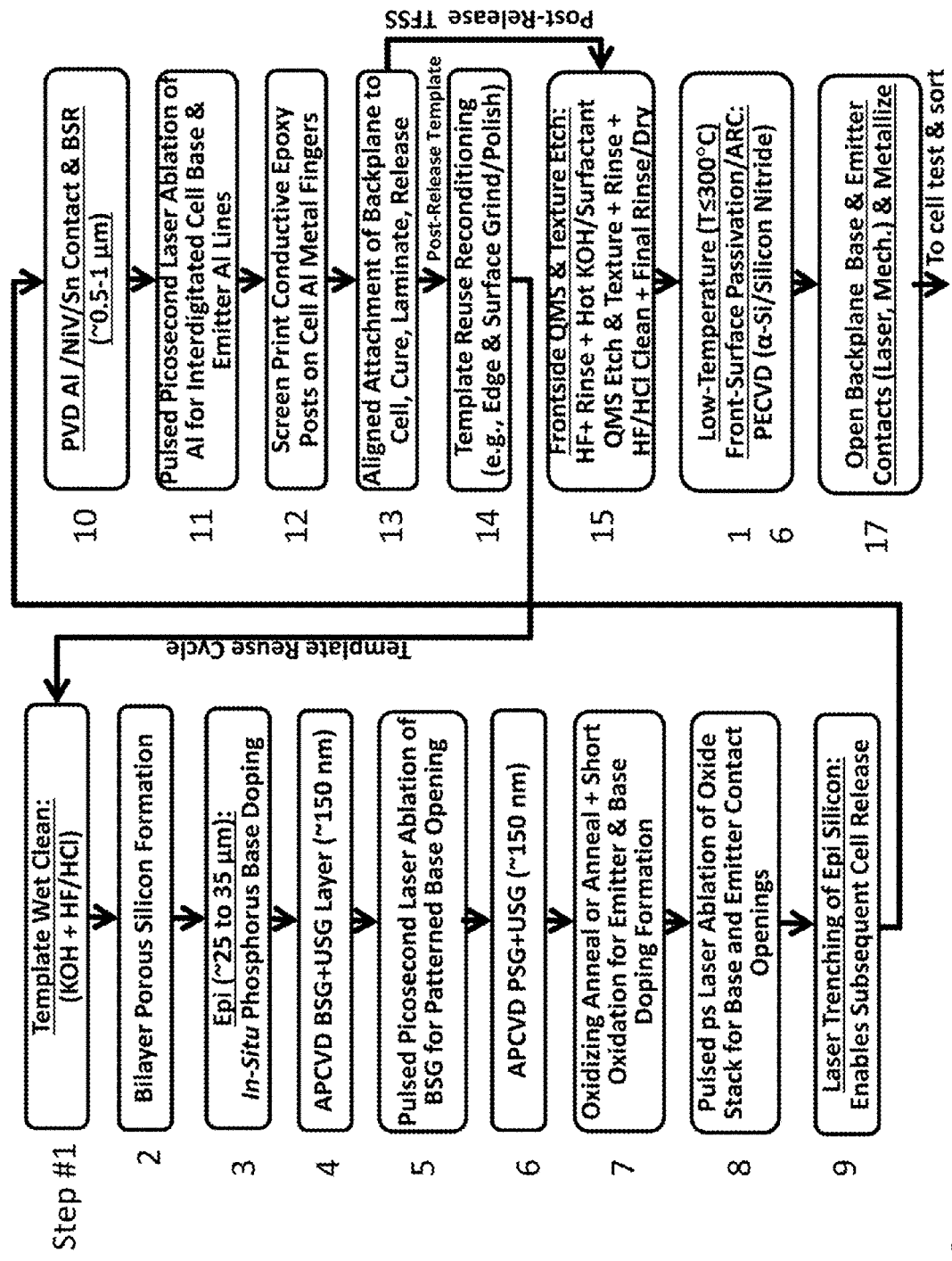
FIG. 14 is a process flow embodiment for forming a back-junction/back-contact epitaxial silicon solar cell using wet etching to form the texture on the cell front surface.

FIG. 14 is a process flow embodiment for forming a back-junction/back-contact epitaxial silicon solar cell using wet etching to form the texture on the cell front surface, for example forming the back contact cell shown in FIG. 3.

Figure 15:
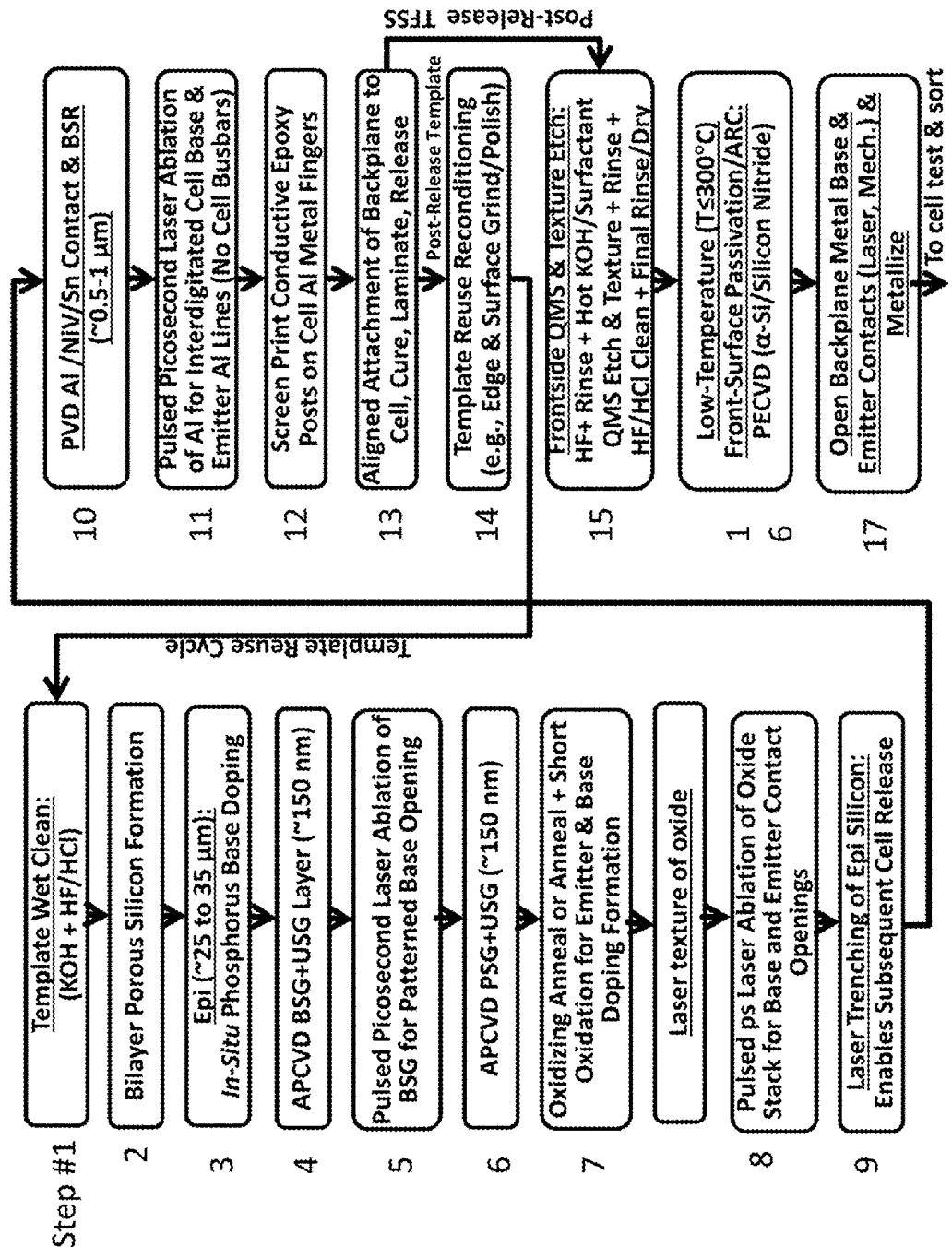
FIG. 15 is a process flow embodiment for forming a back-junction/back-contact epitaxial silicon solar cell with laser texturization of the backside oxide surface.
Figure 16:
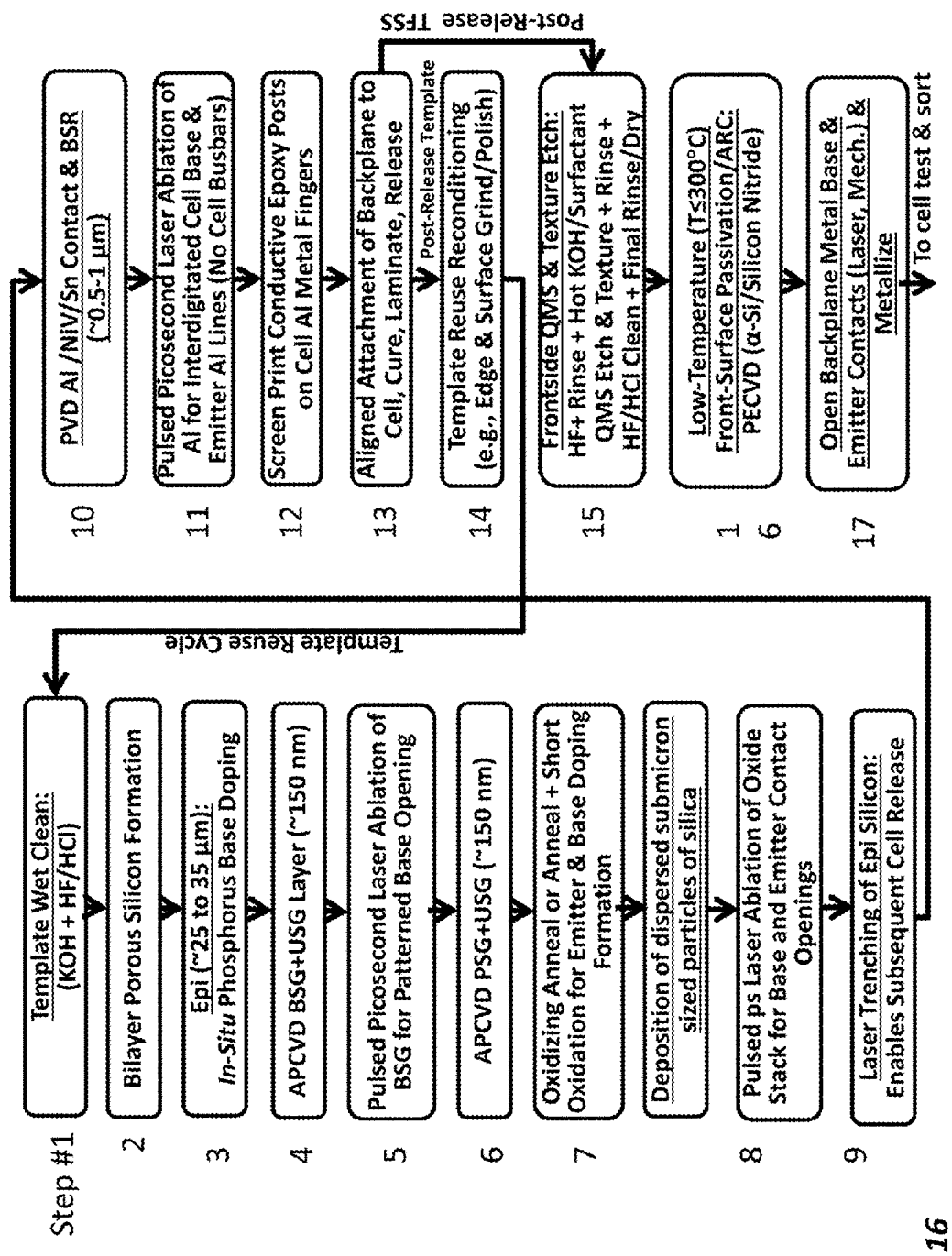
FIG. 16 is a process flow embodiment for forming a back-junction/back-contact epitaxial silicon solar cell using the deposition of dispersed submicron sized silica particle on the surface of oxide on the back side of the solar cell to form a diffuse mirror on the cell backside.

FIG. 15 is a process flow embodiment for forming a back-junction/back-contact epitaxial silicon solar cell with laser texturization of the oxide surface on the back side (laser texturization step between Step 7 and Step 8). FIG. 16 is a process flow embodiment for forming a back-junction/back-contact epitaxial silicon solar cell using the deposition of dispersed submicron sized silica particle on the surface of oxide on the back side of the solar cell to form a diffuse mirror on the cell backside (particle deposition step between Step 7 and Step 8).

Figure 17:
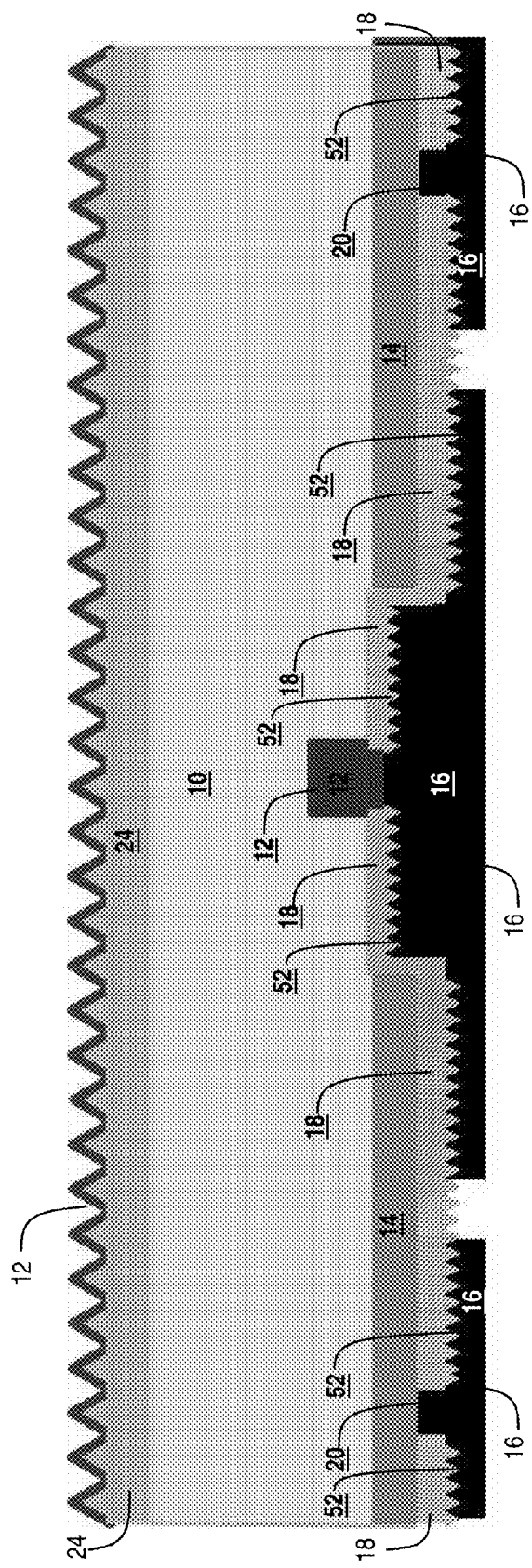
FIG. 17 is a diagram showing a cross-section of a back-junction/back-contact epitaxial silicon solar cell (backplane not shown) with a passivation layer having a textured backside surface.

FIG. 17 is a diagram showing a cross-section of a back-junction/back-contact epitaxial silicon solar cell (backplane not shown) which may be formed according to the process flows of FIGS. 15 and 16. The backside and frontside of the back-junction back-contact epitaxial silicon solar cell of FIG. 17 is similar to that shown in FIG. 5, however, further comprising backside diffuse mirror the backside surface of dielectric layer 18 (for example a silicon oxide layer). For example, backside diffuse mirror 52 may be the laser texturization of the backside surface of passivation layer 18 (for example a silicon oxide passivation layer) or an additive particle containing material layer deposited on passivation layer 18.

The embodiments, structures, and methods disclosed herein provide for the formation of diffuse rear mirrors to enhance IR photon trapping and to enhance the IR quantum efficiency of the solar cells by formation of light-scattering dielectric texture on the cell backside. Detailed diffuse formation embodiments include subtractive laser texturing of the passivation dielectric and additive printing or deposition of a particulate-containing material layer on the backside (thus eliminating the need to texture the silicon surface) which provide high efficiency solar cells.

The following methods and structures provide for a solar cell back surface that provides a diffuse reflection (or so-called lambertian reflection), i.e., a highly diffused reflection with little or negligible specular reflection, to increase the absorption and quantum efficiency of long wavelength sun rays (for example for photons in the ~900 nm to 1150 nm wavelength range). Specific embodiments and aspects disclosed and/or contemplated herein relating to the formation of a diffuse mirror (and which may be combined in various ways), include but are not limited to:

Forming a diffused rear mirror on the back side of front contact front junction solar cells and back contact back junction solar cells by laser texturization of a transparent passivation layer deposited on the backside silicon surface for passivation. In some embodiments, the passivation layer may be silicon oxide, aluminum oxide, silicon nitride, or silicon oxynitride, or in some embodiments ALD Al2O3. Laser parameters for texturization include but are not limited to, a nanosecond pulse width lasers (for example a nanosecond pulse width laser with 157 nm wavelength), or a picoseconds or a femtoseconds laser with wavelength in the range of UV to IR, such as 1064 nm, (for example a femtoseconds laser with a wavelength of UV 355 nm). A sub-oxide of silicon layer may used to increase the absorption of the laser beam. The solar cell may be a thin crystalline silicon film, for example in the range of 10 to 100 microns thick and as low as one micron thick, and formed, for example, by epitaxial deposition and exfoliation from a single crystal silicon template.

Forming a diffused mirror on the back side of front contact front junction solar cells and back contact back junction solar cells by depositing dispersed particles (for example spherical particles) of silica on top of the rear surface passivation layer oxide or aluminum oxide. In one embodiment, silica particles may be formed by pyrolysis of silicon compounds, or by precipitation form sol gels. Alternatively, the spherical particles may be deposited by screen printing of a dielectric paste or inkjet printing of a dielectric ink comprising particles of a suitable dielectric material (for example particles with uniform spherical shaped particle size in the range of submicron up to a few microns or randomized particle shapes and particle sizes in the range of submicron up to a few microns) on top of the rear surface passivation layer oxide or aluminum oxide. The dielectric particles may be made of silicon oxide and/or silicon nitride and/or titanium oxide and/or aluminum oxide and/or another suitable non-absorptive dielectric material. In one embodiment, silica particles may be formed by pyrolysis of silicon compounds, or by precipitation form sol gels. The passivation layer may be, for example, silicon oxide, aluminum oxide, silicon nitride, or silicon oxynitride. The solar cell may be a thin crystalline silicon film, for example in the range of 10 to 100 microns thick and as low as one micron thick, and formed, for example, by epitaxial deposition and exfoliation from a single crystal silicon template.

In operation, the disclosed subject matter provides processing methods for texturing and annealing the substrate surface of a solar cell to capture long wavelength photons from the sun. As well as processing methods for texturing and doping the substrate surface of a solar cell to form a front surface field. As well as processing methods for texturing a passivating layer on the backside substrate surface of a solar cell to capture long wavelength photons from the sun. Further, the disclosed subject matter provides processing methods for texturing and doping the surfaces of a solar cell to form base and emitter regions and laser annealing to remove defects formed in the texturing process.

While the embodiments described herein have been largely explained in conjunction with back contact and front contact silicon solar cells using very thin mono-crystalline silicon absorber layers and backplanes, it should be understood that the aspects of the disclosed subject matter may be applied to other solar cell and module implementations by one skilled in the art, including but not limited to the following: non-crystalline silicon solar cells and modules such as those made from crystalline GaAs, GaN, Ge, and/or other elemental and compound semiconductors; and, wafer-based solar cells including back-contact/front-junction, back-contact/back-junction and front-contact solar cells made from crystalline semiconductor wafers (such as crystalline silicon wafers).

The foregoing description of the exemplary embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

What is claimed is:

1. A method for making a crystalline silicon solar cell substrate, said method comprising the steps of: providing a crystalline silicon substrate for use in an all back-contact back-junction solar cell; applying a first pulsed laser beam to the backside surface of said silicon substrate; texturing the backside surface of said silicon substrate using said first pulsed laser beam, said first pulsed laser beam having a picosecond pulse width and an infrared wavelength; applying a second pulsed laser beam to said textured backside surface; and annealing said backside surface of said silicon substrate using said second pulsed laser beam, said annealing process removing laser damage; further comprising the steps of: applying said first pulsed laser beam to the frontside surface of said silicon substrate; texturing said frontside surface of said silicon substrate with said first pulsed laser beam; depositing a dopant on the frontside surface of said thin silicon substrate; and doping said frontside of said silicon substrate with third pulsed laser beam, said laser doping process forming a front surface field.

2. The method of claim 1, wherein said crystalline silicon substrate has thickness less than 100 microns.

3. The method of claim 1, wherein said pulsed laser beam has a pulse width of less than 1000 picoseconds.

4. The method of claim 1, wherein the said laser beam has a wavelength in the range of 355 nm to 1064 nm.

5. The method of claim 1, wherein said second pulsed laser beam has a nanosecond pulse width and a 532 nm wavelength.

6. The method of claim 1, wherein said third pulsed laser beam forming a front surface field on said frontside of said thin silicon substrate has a nanosecond pulse width and an 532 nm wavelength.

7. A method for making of processing a crystalline silicon solar cell substrate, said method comprising the steps of: forming base regions and emitter regions in said silicon substrate; forming a backside passivation layer on the backside surface of said silicon substrate; applying a first pulsed laser beam to the backside passivation layer; and forming a backside diffuse mirror on the backside surface of said passivation layer by texturing said backside surface of said passivation layer with said first pulsed laser beam; further comprising the steps of: applying said first pulsed laser beam to the frontside surface of said silicon substrate; texturing said frontside surface of said thin silicon substrate with said first pulsed laser beam; depositing a dopant on the frontside surface of said thin silicon substrate; and forming a front surface field on said frontside of said thin silicon substrate with a second pulsed laser beam.

8. The method of claim 7, where said silicon substrate has thickness less than 100 microns.

9. The method of claim 7, wherein said backside passivation layer comprises deposited oxide, silicon nitride, silicon oxynitride, aluminum oxide, or atomic layer deposited aluminum oxide.

10. The method of claim 7, where said first laser beam has a nanoseconds pulse width and 157 nm wavelength.

11. The method of claim 10, where said first laser beam has a femtoseconds pulse width and the wavelength in the range of 355 nm to 1064 nm.

12. The method of claim 7, wherein said backside passivation layer is silicon oxide.

13. The method of claim 7, wherein said backside passivation layer is aluminum oxide.

* * * * *